(12) United States Patent
Kawamura

(10) Patent No.: US 7,102,928 B2
(45) Date of Patent: Sep. 5, 2006

(54) SEMICONDUCTOR MEMORY APPARATUS

(76) Inventor: Shouichi Kawamura, c/o Fujitsu Limited, 1-1, Kamikodanaka 4-chome, Nakahara-ku, Kawasaki-shi, Kanagawa 211-8588 (JP)

( * ) Notice: Subject to any disclaimer, the term of this patent is extended or adjusted under 35 U.S.C. 154(b) by 0 days.

(21) Appl. No.: 10/304,762

(22) Filed: Nov. 27, 2002

(65) Prior Publication Data

US 2003/0072175 A1  Apr. 17, 2003

Related U.S. Application Data

(63) Continuation of application No. PCT/JP00/04310, filed on Jun. 29, 2000.

(51) Int. Cl.
*G11C 16/00* (2006.01)

(52) U.S. Cl. .................. 365/185.17; 365/63
(58) Field of Classification Search ............ 365/185.17, 365/185.11, 230.03, 63
See application file for complete search history.

(56) References Cited

U.S. PATENT DOCUMENTS

| 4,277,836 A | 7/1981 | Kawakami ............ 365/230.03 |
| 4,799,197 A | 1/1989 | Kodama et al. ............ 365/207 |
| 4,916,667 A | 4/1990 | Miyabayashi et al. ...... 365/207 |
| 5,014,246 A * | 5/1991 | Komatsu et al. ........ 365/230.03 |
| 5,475,634 A * | 12/1995 | Wang et al. ............ 365/185.17 |
| 5,682,350 A * | 10/1997 | Lee et al. ............... 365/185.11 |
| 5,894,435 A * | 4/1999 | Nobukata ............... 365/185.17 |
| 5,912,842 A | 6/1999 | Chang et al. .......... 365/185.11 |
| 6,134,163 A * | 10/2000 | Takahashi ............... 365/230.03 |
| 6,134,172 A * | 10/2000 | Barth et al. ............ 365/230.03 |

FOREIGN PATENT DOCUMENTS

| JP | 06-103789 | 4/1994 |
| JP | 07-105693 | 4/1995 |
| JP | 07-114794 | 5/1995 |
| JP | 09-022600 | 1/1997 |
| JP | 11-195300 | 7/1999 |
| JP | 11-273375 | 10/1999 |

* cited by examiner

*Primary Examiner*—Tan T. Nguyen
(74) *Attorney, Agent, or Firm*—Arent Fox PLLC

(57) ABSTRACT

A semiconductor memory apparatus that accelerates the reading of data is provided with a memory cell, bit lines each sectioned into at least two portions, a device for reading data from a memory cell, each provided in between and connecting sectioned bit lines, and a device for connecting one of divided bit lines to the device for reading data or disconnecting connected one of sectioned bit lines from the device for reading data, depending on the position of the memory cell to be read.

7 Claims, 18 Drawing Sheets

SEMICONDUCTOR MEMORY APPARATUS

This is a continuation of PCT/JP00/04310 filed on Jun. 29, 2000.

TECHNICAL FIELD

The present invention relates to a semiconductor memory apparatus.

BACKGROUND ART

A conventional NAND-type flash memory requires a data transfer time (random access time) of about 7 μs to transfer data from a memory cell to a page buffer circuit. This time period depends on the layout of a memory cell array and the method of fetching data.

FIG. 1 is a block diagram showing the entire configuration of a general NAND-type flash memory. As showed in FIG. 1, the conventional general NAND-type flash memory 1 is provided with the following: a logic controller 3, a control circuit 5, an I/O control circuit 7, a command register 9, an address register 11, a status register 13, a state representation circuit 15, a terminal 16, a high voltage generation circuit 17, a row address buffer 19, a row address decoder 21, a memory cell array 23, a column address buffer 25, a column decoder 26, a data register 27, a bus OBUS, a sense amp 28, and an N-channel MOS transistor NT1.

A page buffer circuit PB is configured by the data register 27 and the sense amp 28. Additionally, the data register 27 includes the data latch circuit DL configuring the page buffer circuit PB, and the sense amp 28 includes a sense amp circuit SA configuring the page buffer circuit PB.

In the above NAND-type flash memory, the logic controller 3 is provided with a command enable signal /CE, a command latch enable signal CLE, an address latch enable signal ALE, a write enable signal /WE, and a read enable signal /RE.

On the other hand, the I/O control circuit 7 is connected to input terminals 6 to which signals I/O0–I/O7 are provided, further connected to the status register 13, and provided with the command latch enable signal CLE, the address latch enable signal ALE, the write enable signal /WE, and an internal power supply voltage $V_{ccq}$. The command register 9 and the address register 11 are connected to the I/O control circuit 7. The status register 13, the state representation circuit 15, and the high voltage generation circuit 17 are connected to the control circuit 5. The gate of the N-channel MOS transistor NT1 is connected to the state representation circuit 15 with its source being grounded and its drain being connected to the terminal 16 that outputs a busy signal /BY.

Additionally, the row address buffer 19 is connected to the address register 11, and the row address decoder 21 and the memory cell array 23 are connected to the high voltage generation circuit 17. Furthermore, the row address decoder 21 is connected to the control circuit 5, and the memory cell array 23 is connected to the row address decoder 21.

Additionally, the column address buffer 25 is connected to the address register 11, and the column decoder 26 is connected to the column address buffer 25. The data register 27 is connected to the I/O control circuit 7 via the bus OBUS and further to the column decoder 26. Furthermore, the sense amp 28 is connected between the data register 27 and the memory cell array 23, and further connected to the control circuit 5.

FIG. 2 is a schematic drawing showing the layout of the memory cell array 23 showed in FIG. 1, and FIG. 3 is a circuit diagram showing the equivalent circuit of the memory cell array 23 showed in FIG. 2. As showed in FIG. 2, the following are formed in the memory cell array 23: a plurality of bit lines BL connected to the page buffer circuit PB, a plurality of word lines WL0a–WL15a, WL0b–WL15b, and WL0c–WL15c, a plurality of select gate lines SG1a, SG2a, SG1b, SG2b, SG1c, the word lines and the select gate lines being perpendicular to the bit lines BL, a plurality of select gate transistors SGTr, and a plurality of memory cells MC, the select gate transistors SGTr and the memory cells MC being described later. The memory cells MC and the select gate transistors SGTr that are connected serially are connected to the bit lines BL via the bit line contact units BC.

On the other hand, FIG. 3(a) shows the entire configuration of the memory cell array 23, and FIG. 3(b) is a circuit diagram showing the configuration of a portion 29 showed in FIG. 3(a). In addition, in FIG. 3(a), the memory cell array 23 is simplified.

As showed in FIG. 3(a), the memory cell array is configured by a series of (N+1) blocks from the $0^{th}$ block to the Nth block provided in the direction of the bit line BL. The memory cell array includes the bit lines BL connected to the page buffer circuit PB. And, as showed in FIG. 3(b), each block configuring the NAND-type flash memory includes a string ST connected to the bit lines BL. The string includes a plurality of serially connected memory cells MC and the select gate transistors SGTr serially connected on both sides.

A corresponding word line WL0a–WL15a, WL0b–WL15b, or WL0c–WL15c is connected to each gate of the above memory cell MC configured by a flash memory. A corresponding select gate line SG1a, SG2a, SG1b, SG2b, SG1c, or SG2c is connected to each gate of the select gate transistor SGTr.

Additionally, in the above configuration, the size of the page buffer circuit PB is correspondingly determined based on the page size, 528 bytes (4,224 bits), for example, being the unit of writing and reading of data of the NAND-type flash memory. When data are transferred, the page buffer amplifies and latches a whole page of data.

FIG. 4 is a circuit diagram showing the configuration of the page buffer circuit PB showed in FIG. 1. As showed in FIG. 4, the page buffer circuit PB is provided with the sense amp circuit SA, a data latch circuit DL, a tri-state buffer TSB, and N-channel MOS transistors NT2 and NT8.

The sense amp circuit SA includes N-channel MOS transistors NT9, NT10, and a P-channel MOS transistor PT3. The data latch circuit DL includes a latch circuit 30 and N-channel MOS transistors NT6 and NT7. And the tri-state buffer TSB includes N-channel MOS transistors NT3–NT5 and P-channel MOS transistors PT1 and PT2.

Here, the source and drain of the N-channel MOS transistor NT2 are connected in series to the bus OBUS, and a signal YD1 is provided to its gate from the column decoder 26. Additionally, the signal LD is provided from the control circuit 5 to the gate of the N-channel MOS transistor NT5 and the gate of the P-channel MOS transistor PT2 and the signal RD is provided from the control circuit 5 to the gate of the N-channel MOS transistor NT3. Likewise, a signal SET is provided from the control circuit 5 to the gate of the N-channel MOS transistor NT7, and a signal PGMON is provided from the control circuit 5 to the gate of the N-channel MOS transistor NT8.

Additionally, a signal BLCNTRL is provided from the control circuit 5 to the gate of the N-channel MOS transistor NT9. A signal DIS is provided from the control circuit 5 to the gate of the N-channel MOS transistor NT10, and a signal PBIAS is provided from the control circuit 5 to the gate of the P-channel MOS transistor PT3. In addition, the source and drain of the N-channel MOS transistor NT9 are connected in series to the bit line BL.

In the page buffer circuit PB configured as described above, a high level signal BLCNTRL provided to the gate of the N-channel MOS transistor NT9 connects the bit line BL to the sense amp circuit SA. In addition, when data are transferred, a low level signal PBIAS provided to the gate of the P-channel MOS transistor PT3 causes the P-channel MOS transistor PT3 to provide sense current Iref to the bit line BL.

Additionally, the N-channel MOS transistor NT10, when a high level signal DIS is provided to its gate, discharges the bit line BL. In the initial stage of data transfer, when the N-channel MOS transistor NT8 is turned on in response to a signal PGMON, the N-channel MOS transistor NT10 resets the node A included in the latch circuit 30 to a low level.

On the other hand, the N-channel MOS transistors NT6 and NT7 are serially connected to a node B included in the latch circuit 30. The gate of the N-channel MOS transistor NT6 is connected to a node SNS. Accordingly, the N-channel MOS transistor NT6 turns on and off in response to data amplified by the sense amp SA. The data are latched by the latch circuit 30 in response to a signal SET provided to the gate of the N-channel MOS transistor NT7.

The above signals RD and LD turn to a high level when data are read from and loaded to the memory cell MC, respectively. For example, when the signal RD is turned to a high level, the tri-state buffer TSB is enabled. During this period, the tri-state buffer TSB inversely amplifies the signal level at the node A, and provides data generated by inversely amplifying to the bus OBUS via the N-channel MOS transistor NT2.

On the other hand, the signal LD, when it turns to a high level, disables the tri-state buffer TSB. Data are provided to the node A from the bus OBUS via the N-channel MOS transistor NT2 and NT5.

The data transfer operation of the NAND-type flash memory configured as above will be described by reference to timing charts showed in FIGS. 5 and 6 as follows. FIG. 5 shows timing in which data "0" of the memory cell array showed in FIGS. 2 and 3 are transferred.

As showed in FIG. 5(a), a command latch enable signal CLE is turned to a high level (H) at time T1 to start data transfer, and as showed in FIG. 5(c), a write enable signal /WE is turned to a low level (L). In response to these signals, as showed in FIG. 5(d), the flash memory acquires a command through the I/O terminal 6. This command is latched in the command register 9 when the write enable signal /WE turns to the high level (also referred to as "rise"). As showed in FIG. 5(g), in response to the above command indicating an instruction of the reading of data, the control circuit 5 turns the signal RD to a high level.

As showed in FIG. 5(b), an address latch enable signal ALE is turned to a high level at time T2, and as showed in FIG. 5(c), an address Add is input by toggling the write enable signal /WE. This address Add is latched by the address register 11 in response to a rise in the write enable signal /WE as well as the above command.

After the inputting of the address, the device automatically starts the data transfer operation. Specifically, as showed in FIGS. 5(e) and (f), the control circuit 5 turns a signal DIS and the signal PGMON to high levels at time T3.

In response to this, as showed in FIGS. 5(n) and (o), the nodes A and B of the data latch circuit DL included in the page buffer circuit PB showed in FIG. 4 are reset to a low level and a high level, respectively.

In this case, as showed in FIGS. 5(j) and (k), select gate lines SG1a and SG2a of the selected block in the memory cell array are each activated to a high level of 4 V, for example, at time T4. Additionally, a selected word line is turned to a low level of 0 V, for example, and an unselected word line is turned to a high level of 4 V, for example.

Now, as showed in FIG. 5(i), a signal BLCNTRL is turned to a high level of 1.5 V, for example, and as showed in FIG. 5(h), a signal PBIAS is lowered so that a sense current Iref showed in FIG. 4 becomes a desired level of 1 μA, for example.

Therefore, the sense amp circuit SA included in the page buffer circuit PB is connected to the bit line BL, and the above sense current Iref flows in the bit line BL. And voltage caused by the difference between the sense current Iref and the current that flows through the selected memory cell MC appears as the voltage of the node SNS showed in FIG. 5(m).

When the memory cell MC does not stores data "0" as described above, no current flows in the memory cell MC. Accordingly, as showed in FIG. 5(m), the voltage at the node SNS starts rising at time T5 due to the above sense current Iref. And, as showed in FIG. 5(l), the control circuit 5 has a signal SET transit to a high level at time T6 after a long enough time passes for the voltage of the node SNS to be stabilized at a high level.

Because, as showed in FIG. 5(m), the voltage of the node SNS is at a high level, the N-channel MOS transistor NT7 showed in FIG. 4 turns on, and the node B of the data latch circuit DL is drawn to the low level. As showed in FIGS. 5(n) and (o), the node A turns to a high level and the node B turns to a low level at time T7. In response to this, data output at the node A are inverted by the tri-state buffer TSB, and data "0" are provided to the I/O control circuit 7 via the bus OBUS. The I/O control circuit 7 outputs data "0" to the exterior through the I/O pins 6.

The reading operation of data "0" in the case of a conventional NAND-type flash memory has been described above. The transfer operation of data "0" of the memory cell array showed in FIGS. 2 and 3 will be described by reference to FIG. 6. Since the inputting of the command and the address is the same as the reading operation of data "0" described above, its description will not be given.

As showed in FIGS. 6(e) and (f), the control circuit 5 turns the signal DIS and the signal PGMON to high levels at time T3 after the inputting of the address. Consequently, in the data latch circuit DL showed in FIG. 4, the node A and the node B are reset to a low level and a high level, respectively. The select gate lines SG1a and SG2a included in a selected block in the memory cell array are each turned to a high level at time T4, a selected word line is turned to a low level, and an unselected word line is turned to a high level.

As showed in FIG. 6(i), the signal BLCNTRL is turned to a high level at time T5, and the signal PBIAS is lowered so that the sense current Iref showed in FIG. 4 becomes at a desired level.

The sense amp circuit SA included in the page buffer circuit PB is connected to the bit line BL, and the above sense current Iref flows through the bit line BL. The difference between the sense current Iref and the current flowing through the selected memory cell MC results in voltage at the node SNS showed in FIG. 6(m).

Now, when the memory cell MC stores data "1" as described above, the memory cell MC causes the current flow so that, as showed in FIG. 6(m), the node SNS is discharged to a low level. And, the control circuit 5 has the signal SET transit to a high level at time T6 after a long enough time passes for the voltage of the node SNS to stabilize at a low level.

At this point, since the voltage of the node SNS is at a low level as showed in FIG. 6(m), the node B of the data latch circuit DL sustains a high level state, and, as showed in FIGS. 6(n) and (o), the nodes A and B become at a low level and at a high level, respectively. Consequently, data output at the node A are inverted by the tri-state buffer TSB, and data "1" are provided to the I/O control circuit 7 through the bus OBUS. In addition, the I/O control circuit 7 outputs the data "1" to the exterior through the I/O terminal 6.

In accordance with the above description, time required for completing the reading operation (data transfer) of data "0" is, as showed in FIG. 5, the sum of the time period Ta from time T3 to time T4 and time period Tb from time T4 to time T7. The time Ta is, as described above, time required to reset the data latch circuit DL and to set the select gate lines SG1a, SG2a, in a selected block, and the unselected word line at a high level. The time Tb is time required to charge the bit line BL with the sense current Iref so that the voltage of the node SNS is stabilized at the high level. The above times Ta and Tb may overlap depending on the case.

In addition, the above time Tb depends on the following: the capacitance and resistance of the bit line BL, the capacitance of the diffusion layer of the select gate transistor SGTr connected to the bit line BL, and the above sense current Iref.

DISCLOSURE OF INVENTION

It is a general object of the present invention to provide an improved and useful semiconductor memory apparatus of which the reading operation of data is accelerated and in which the above-mentioned problems are eliminated.

The objects of the present invention are achieved by a semiconductor memory apparatus having memory cells connected to bit lines and word lines, comprising said bit lines divided into at least two fractions, a reading means connectedly provided between the divided bit lines for reading data from said memory cells, and a switching means for connecting the divided bit lines to said reading means or disconnecting the divided bit lines from said reading means depending on the location of the memory cell of which data are to be read.

And, the main advantage of the present invention is that the semiconductor memory apparatus can accelerate its reading operation of data by providing reading means between divided bit lines so that the capacitance of the bit lines driven by the reading means is reduced, without expanding the circuit scale.

BEST MODE FOR CARRYING OUT THE INVENTION

Figure 1:
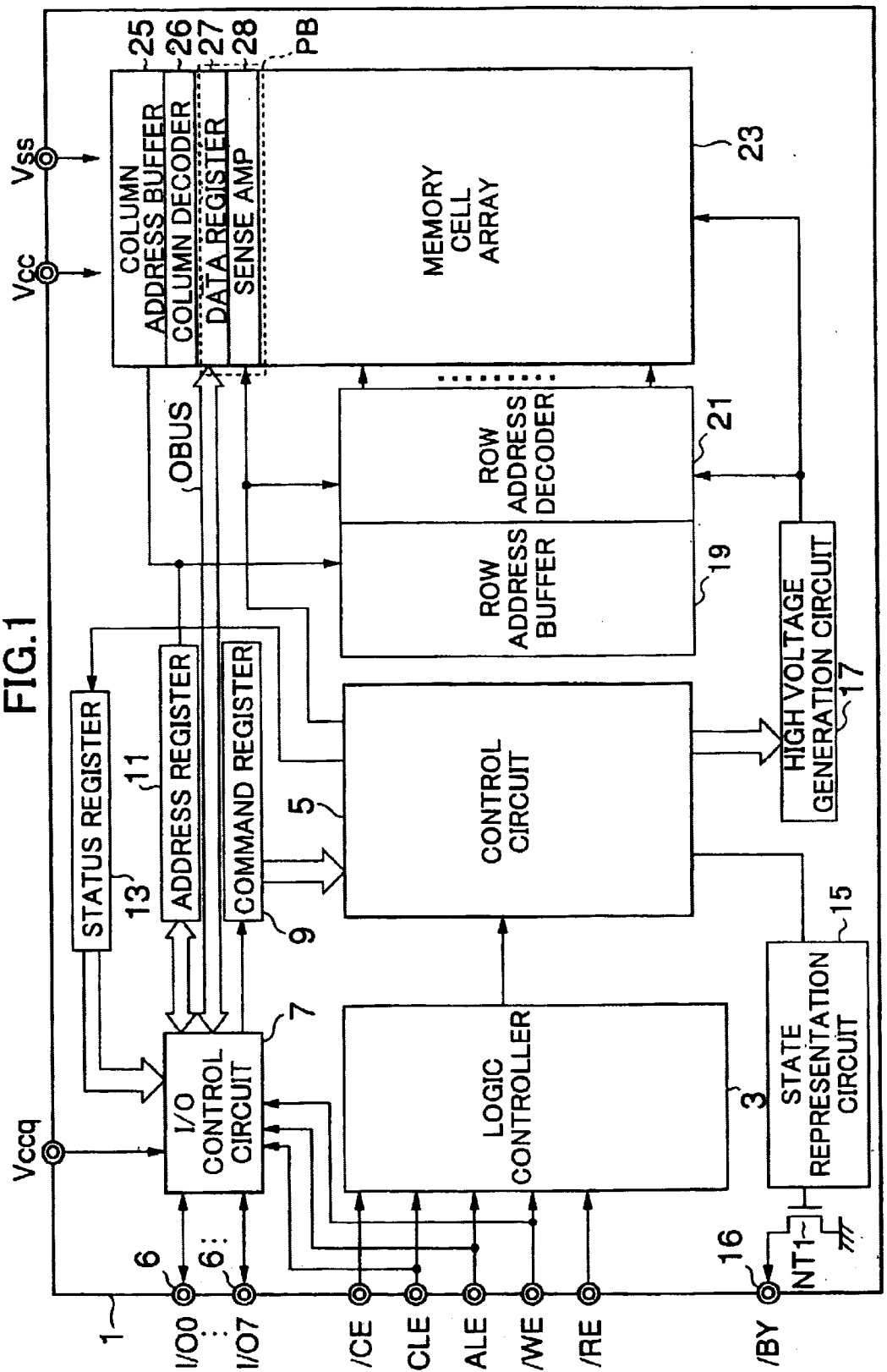
FIG. 1 is a block diagram showing the entire configuration of a conventional semiconductor memory apparatus provided with a general NAND-type flash memory.
Figure 2:
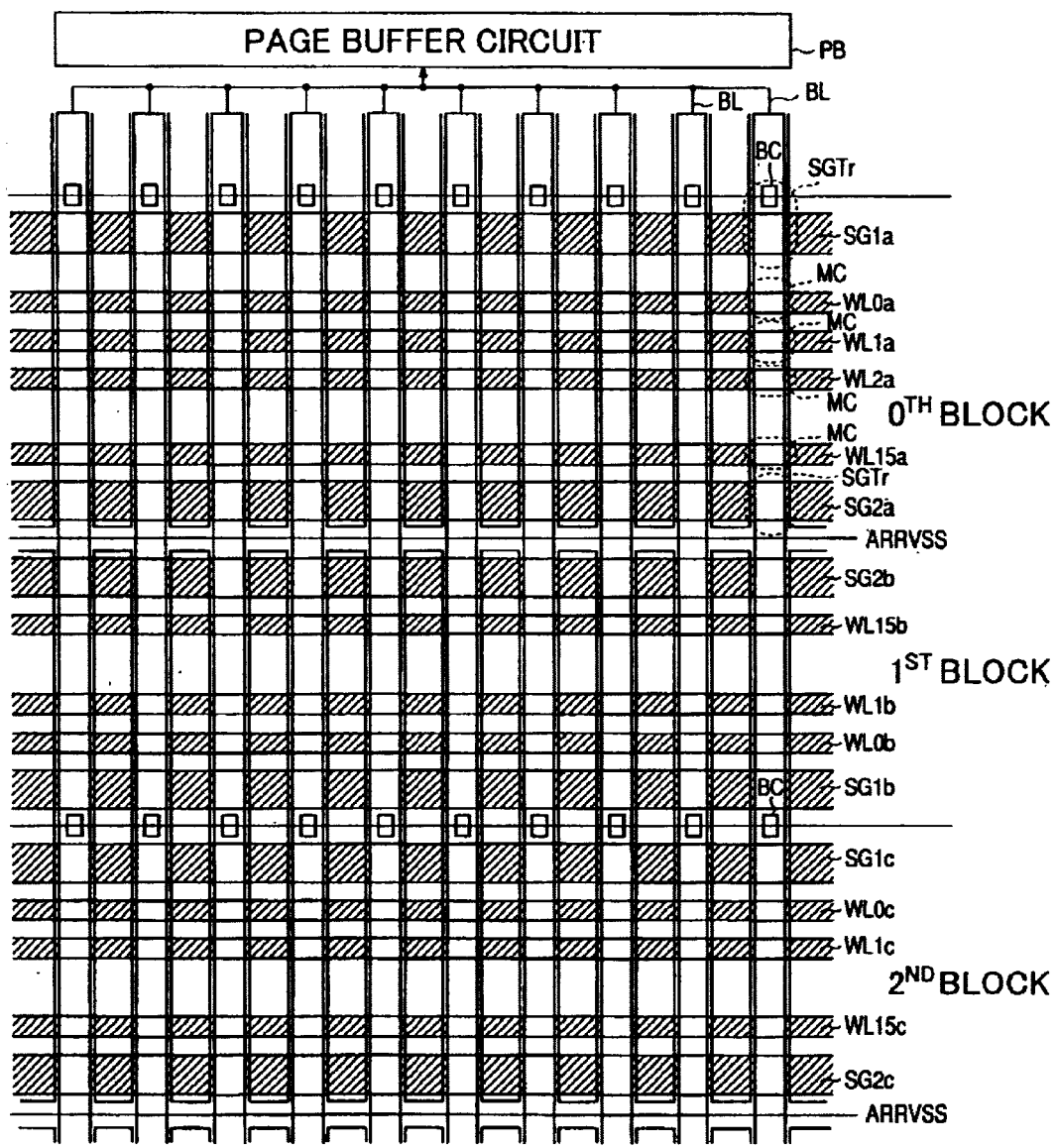
FIG. 2 is a schematic diagram showing the layout of the memory cell array showed in FIG. 1.

A semiconductor memory apparatus according to the present invention will be described in detail below by reference to the drawings. The same numeral in the drawings indicates the same or equivalent components.

In a conventional semiconductor memory apparatus including a NAND-type flash memory, the reading operation of data can be accelerated by reducing the capacity of bit lines or increasing sense current Iref. The capacity of bit lines is efficiently reduced by sectioning the bit lines. In that case, it is necessary to dispose the sectioned bit lines as close as possible to the page buffer circuit PB.

If a page buffer circuit is provided to each sectioned bit line, the circuit scale expands greatly. Accordingly, sectioning the bit lines is not a practical solution for the acceleration of the reading operation of data.

The method of increasing the sense current Iref as described above will be considered. A NAND-type flash memory transfers data by the page, that is, data of 4,224 bits are transferred at a time. In the case where the sense current Iref is increased, current of the increment multiplied by 4,224 is additionally consumed. For example, in situations where the sense current Iref is increased from 1 μA to 200 μA, current of the increment 199 μA is multiplied by 4,224, or 840 mA is additionally consumed. Therefore, the method of increasing the sense current Iref is also impractical.

In consideration of the above, a semiconductor memory apparatus is provided with a page buffer circuit PB disposed on one side of the memory cell array, and the memory cell array is divided into two regions, the first region including a plurality of blocks close to the page buffer circuit PB and the second region including the other blocks. N-channel MOS transistors between the two divided regions to whose gates the signal GSG is provided are described later (hereinafter, these transistors are referred to as "GSG transistors"). In addition, the bit lines are divided into two portions as well as the memory cell array. That is, the first bit lines obtained by the dividing are provided between the page buffer circuit PB and the drains of the GSG transistors of the above first region, and one of ends of the second bit lines provided in the above second region are connected to the sources of the GSG transistors.

In regard to the semiconductor memory apparatus as configured as above, in the case of accessing the first region in the memory cell array that is close to the page buffer circuit PB, the GSG transistors are turned off. Accordingly, since only the first bit lines are connected to the page buffer circuit PB, the capacitance of the bit lines can be reduced and, consequently, data transfer time becomes shorter than that of the conventional NAND-type flash memory without increasing the sense current Iref.

On the other hand, in the case of accessing the second region in the memory cell array, the first bit lines and the second bit lines are connected to the page buffer circuit PB by turning on the GSG transistors. Therefore, the reading operation of data in this case is performed almost at the same speed as the conventional NAND-type flash memory. As described above, the memory array of a semiconductor memory apparatus according to an embodiment of the present invention is provided in the first region of which data can be read faster than a conventional memory array and in the second region of which data can be read almost at the same speed as the conventional memory array.

In the following description, the difference of a semiconductor memory apparatus according to an embodiment of the present invention from the conventional semiconductor memory apparatus showed in FIG. 1 will be described in more detail.

[The First Embodiment]

Figure 7:
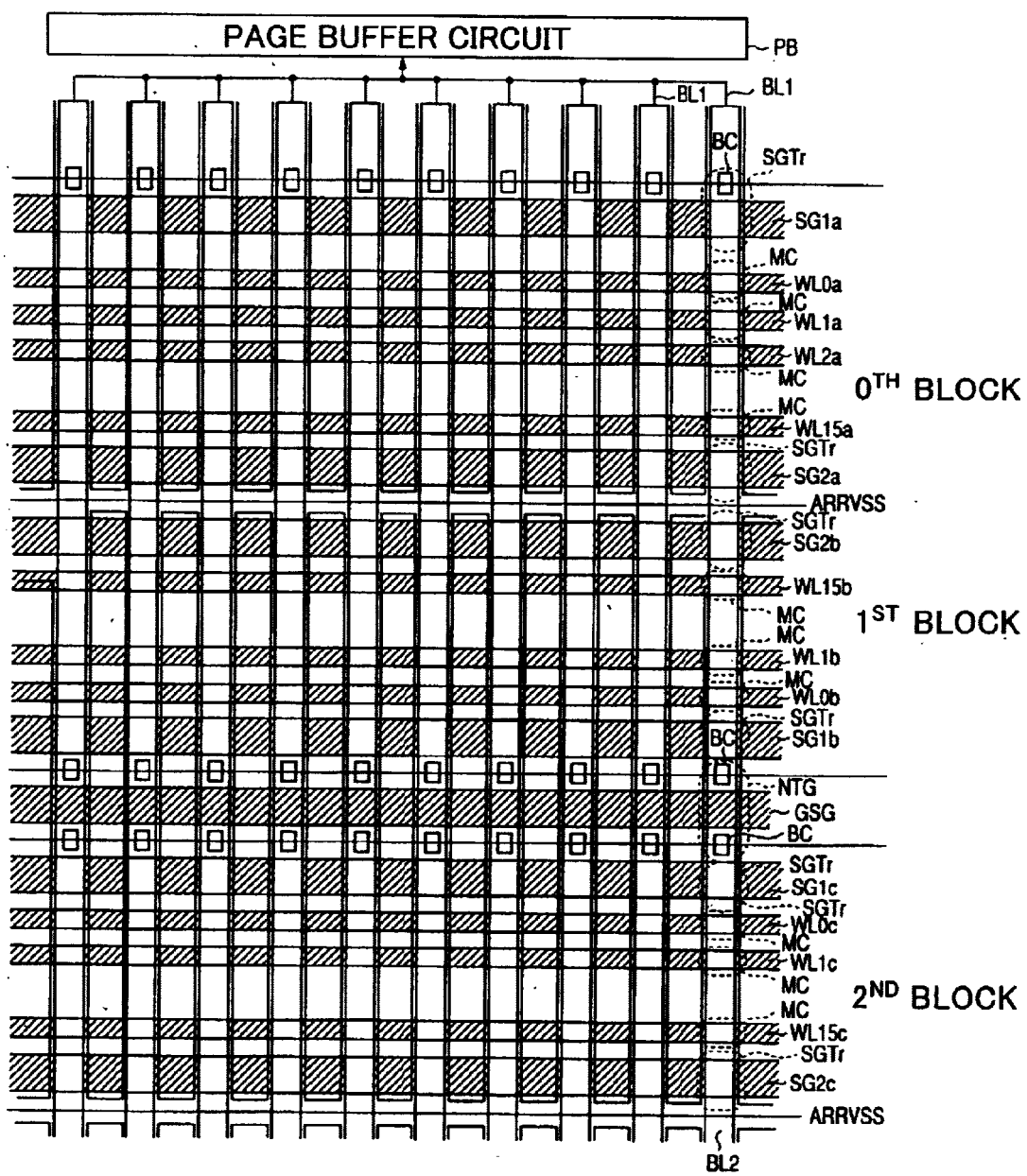
FIG. 7 is a schematic diagram showing the layout of a memory cell array included in a semiconductor memory apparatus according to the first embodiment of the present invention.
Figure 8:
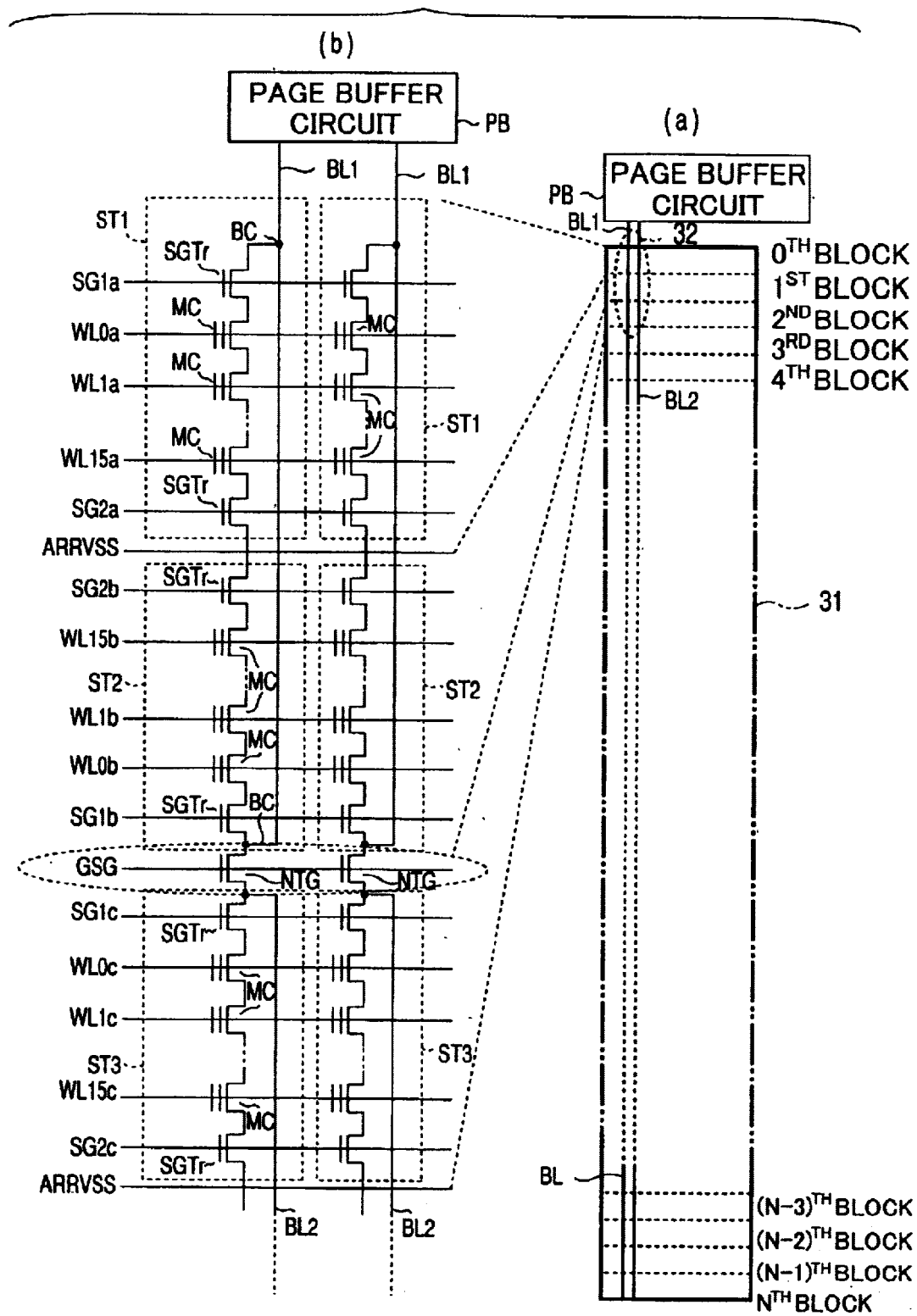
FIG. 8 is a circuit diagram showing the equivalent circuit of the memory cell array showed in FIG. 7.

FIG. 7 is a schematic diagram showing the layout of a memory cell array included in a semiconductor memory apparatus according to the first embodiment of the present invention, and FIG. 8 is a circuit diagram showing the equivalent circuit of the memory cell array showed in FIG. 7.

As showed in FIG. 7, the following are formed in the memory cell array: bit lines BL1 connected to the page buffer circuit PB, bit lines BL2 connected to bit lines BL1 via GSG transistors NTG to be described later, a plurality of word lines WL0a–WL15a, WL0b–WL15b, WL0c–WL15c and a plurality of select gate lines SG1a, SG2a, SG1b, SG2b, SG1c, and SG2c that are perpendicular to the bit lines BL1 and BL2, select gate transistors SGTr, memory cells MC, and GSG transistors NTG. The memory cells MC and the select gate transistors SGTr that are serially connected are connected to the bit lines BL1 and the bit lines BL2 via bit line contact units BC. As showed in FIG. 7, the drains of the above GSG transistors NTG are connected to the bit lines BL1 via the bit line contacting units BC, and the sources are connected to the bit lines BL2 via the bit line contacting units BC.

On the other hand, FIG. 8(a) shows the entire structure of the memory cell array 31, and FIG. 8(b) is a circuit diagram showing the structure of portion 32 showed in FIG. 8(a). In FIG. 8(a), the memory cell array 31 is simplified.

As showed in FIG. 8(a), the memory cell array 31 is configured by "N+1" blocks from "the $0^{th}$ block" to "the Nth block" serially provided in the direction along the bit lines BL1 and BL2. The memory cell array 31 includes the bit line BL1 connected to the page buffer circuit PB and the bit line BL2 connected to the bit line BL1.

As showed in FIG. 8(b), each block configuring the NAND-type flash memory as described above includes a string. For example, the $0^{th}$ block includes a string ST1 connected to the bit line BL1, the $1^{st}$ block includes a string ST2 connected to the bit line BL2, and the $2^{nd}$ block includes a string ST3 connected to the bit line BL2.

Each of the above strings ST1, ST2, and ST3 includes a plurality of serially connected memory cells MC and select gate transistors SGTr serially connected to both sides of the plurality of memory cells MC. In addition, each of the word lines WL0a–WL15a, WL0b–WL15b, and WL0c–WL15c are connected to the gate of corresponding memory cell MC. Each of the select gate lines SG1a, SG2a, SG1b, SG2b, SG1c, and SG2c is connected the gate of corresponding select gate transistor SGTr.

As showed in FIG. 8(b), GSG transistors NTG each consisting of an N-channel MOS transistor are provided between and connected to the strings ST2 and ST3. The gates of these GSG transistors NTG are connected to a GSG signal line that transmits a signal GSG. In addition, the above GSG transistors NTG are desired to be of the same type transistor as the above select gate transistors SGTr.

Figure 3:
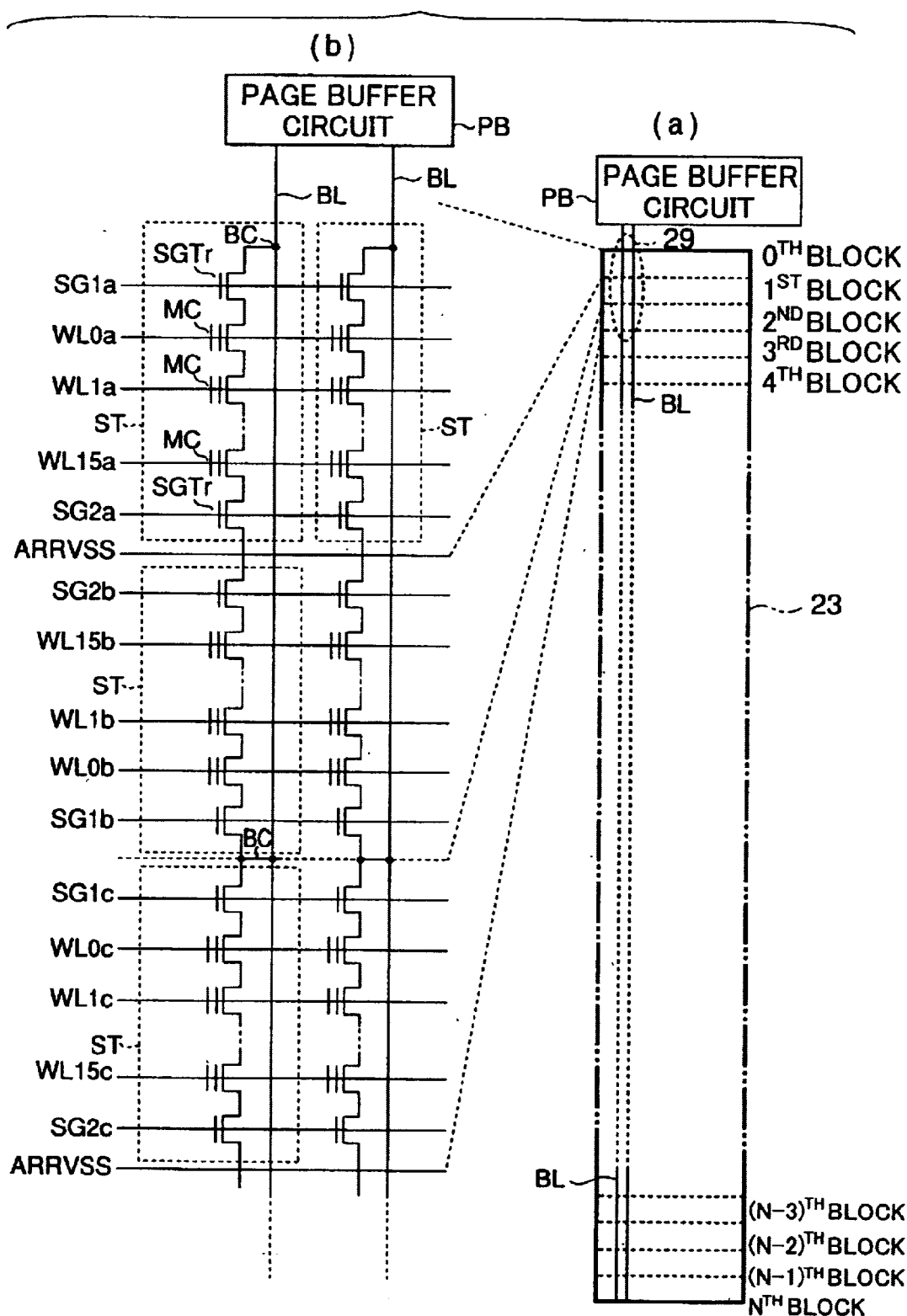
FIG. 3 is a circuit diagram showing the equivalent circuit of the memory cell array showed in FIG. 2.

As for a NAND-type flash memory configured as above, in the case where data are written to and read from a memory cell MC included in the $0^{th}$ block and the $1^{st}$ block, the bit lines BL1 activated by the page buffer circuit PB are shorter than the conventional bit lines BL showed in FIG. 3, and accordingly, the resistance and capacitance of the activated bit lines BL are reduced.

For example, if the memory cell array 31 showed in FIG. 8 is assumed to consist of 1,024 blocks serially provided in the direction of the bit lines BL1 and BL2, the resistance and capacitance of the bit lines BL1 that the page buffer circuit PB activates, when accessing the memory arrays MC included in the $0^{th}$ block and the $1^{st}$ block, becomes 1/512 of the resistance and capacitance of the conventional bit lines BL connected to the 1,024 blocks.

Accordingly, even if the sense current Tref is as great as it is conventionally, the data transfer time for the case of accessing the memory cells MC included in the $0^{th}$ block and the $1^{st}$ block can be reduced from conventional 7 μs to 100 ns. In addition, in the case where the other blocks including the $2^{nd}$ block are accessed, both bit lines BL1 and BL2 are activated by the page buffer circuit PB, data transfer requires almost the same time required by a conventional NAND-type flash memory.

Figure 9:
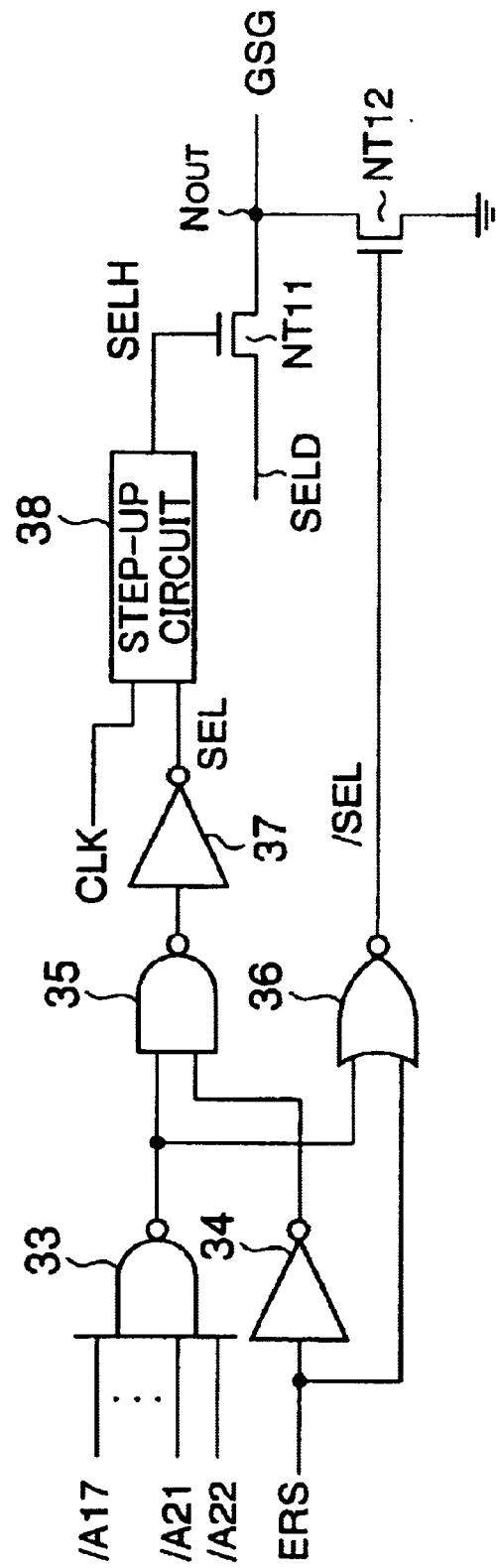
FIG. 9 is a circuit diagram showing the configuration of a GSG decoding circuit showed in FIG. 7 that generates a GSG signal.

FIG. 9 is a circuit diagram showing a GSG decoding circuit that generates a signal GSG showed in FIG. 8. As showed in FIG. 9, the GSG decoding circuit includes the following: NAND circuits 33 and 35, inverter circuits 34 and 37, a NOR circuit 36, a step-up circuit 38, N-channel MOS transistors NT11 and NT12, an output node $N_{OUT}$ that outputs the signal GSG, and a voltage supply node SELD. In addition, the above voltage supply node SELD supplies a predetermined voltage to the gate of the select gate transistor SGTr via the select gate lines SG1a, SG2a, SG1b, SG2b, SG1c, and SG2c.

Address signals /A17–/A22 are provided to the NAND circuit 33, and an erase signal ERS that is activated to a high level in an erasing operation, is provided to the inverter circuit 34. The NAND circuit 35 is connected to the NAND circuit 33 and the inverter circuit 34. The NOR circuit 36 is connected to the NAND circuit 33, and the erase signal ERS is provided to the NOR circuit 36. The inverter circuit 37 is connected to the NAND circuit 35. The step-up circuit 38 is connected to the inverter circuit 37, and a clock signal CLK is provided to the step-up circuit 38.

Moreover, the N-channel MOS transistor NT11 is provided between and connected to the output node NOUT and the voltage supply node SELD. The gate of the N-channel MOS transistor NT11 is connected to the step-up circuit 38. The N-channel MOS transistor NT12 is provided between and connected to the output node NOUT and a ground node. The gate of the N-channel MOS transistor NT12 is connected to the NOR circuit 36.

The operation of the GSG decoding circuit configured as above will be described below. In the case where data are read from the memory cells MC included in the $0^{th}$ block or the $1^{st}$ block, the address signals /A17–/A22 are turned to a high level so that either the $0^{th}$ block or the $1^{st}$ block is selected. Since the signal ERS provided by the control circuit in response to a predetermined command is turned to a low level during this period, the signal SEL output by the inverter circuit 37 and the signal /SEL output by the NOR circuit 36 is turned to a high level.

Consequently, because the step-up circuit 38 is inactivated in response to a low level signal SEL, the signal SELH output by the step-up circuit 38 is turned to a low level. Concurrently, since the N-channel MOS transistor NT12 is turned on, the signal GSG output by the output node NOUT is turned to 0 V.

In the case where data are read from the memory cells MC included in blocks other than the $0^{th}$ block and the $1^{st}$ block, at least one of the address signals /A17–/A22 is turned to a low level so that the blocks are selected. Since the signal ERS provided by the control circuit in response to a predetermined command is turned to a low level, the signal SEL output by the inverter circuit 37 is turned to a high level during this period. The signal /SEL output by the NOR circuit 36 is turned to a low level.

Because the step-up circuit 38 is activated in response to a high-level signal SEL, the step-up circuit 38 generates a signal SELH of which voltage depends on the provided clock signal CLK. Concurrently, since the N-channel MOS transistor NT12 is turned off, the signal GSG output from the output node NOUT is at the voltage provided by the voltage supply node SELD.

The reading operation of data "0" from the $0^{th}$ block of a NAND-type flash memory configured as above will be described by reference to the timing chart showed in FIG. 10.

A command latch enable signal CLE is turned to a high level at time T1 to start data transfer as showed in FIG. 10(a), and a write enable signal /WE is turned to a low level as showed in FIG. 10(c). Consequently, the flash memory receives a command via the I/O terminals 6. This command is latched in the command register 9 when the write enable signal /WE is turned to a high level (also referred to as a "rise"). In addition, the control circuit turns the signal RD to a high level in response to the above command giving an instruction to read data as showed in FIG. 10(g).

As showed in FIG. 10(b), the address latch enable signal ALE is turned to a high level at time T2, and as showed in FIG. 10(c), the write enable signal /WE is toggled to input the address Add. Like the above command, this address Add is latched by the address register 11 in response to the rise of the write enable signal /WE.

After the input of the address, the device automatically starts transmitting data. Specifically, as showed in FIGS. 10(e) and (f), the control circuit turns the signal DIS and the signal PGMON to a high level at time T3. Consequently, the data latch circuit DL included in the page buffer circuit PB is reset so that the node A is turned to a low level and the node B is turned to a high level as showed in FIGS. 10(o) and (p).

As showed in FIGS. 10(k) and (l), the select gate lines SG1a and SG2a of a selected block of the memory cell array are activated to a high level of 4 V, for example, at time T4. Otherwise, the selected word lines are turned to a low level of 0 V, for example, and unselected word lines are turned to a high level of 4V, for example.

Next, as showed in FIG. 10(i), a signal BLCNTRL is turned to a high level of 1.5 V, for example, and as showed in FIG. 10(h), a signal PBIAS is turned to a low level so that the sense current Iref becomes a desired level of 1 μA, for example.

Consequently, the sense amp circuit SA included in the page buffer circuit PB is connected to the bit lines BL1, and the above sense current Iref flows through the bit lines BL1. In addition, in the case for accessing the $0^{th}$ block, as showed in FIG. 10(j), the signal GSG is turned to a low level and the the GSG transistor NTG is turned off. Accordingly, the bit lines BL2 are disconnected from the bit lines BL1.

And, voltage results from the difference between this sense current Iref and the current flowing through the selected memory cell MC as the voltage at the node SNS showed in FIG. 10(n).

When the memory cell MC stores data "0" as described above, the voltage at the node SNS starts rising from time T4 due to the sense current Iref as showed in FIG. 10(n) since no current flows the memory cell MC. And, as showed in FIG. 10(l), at time T6 at which the voltage at the node SNS stabilizes at a high level, the control circuit sets the signal SET at a high level.

Figure 4:
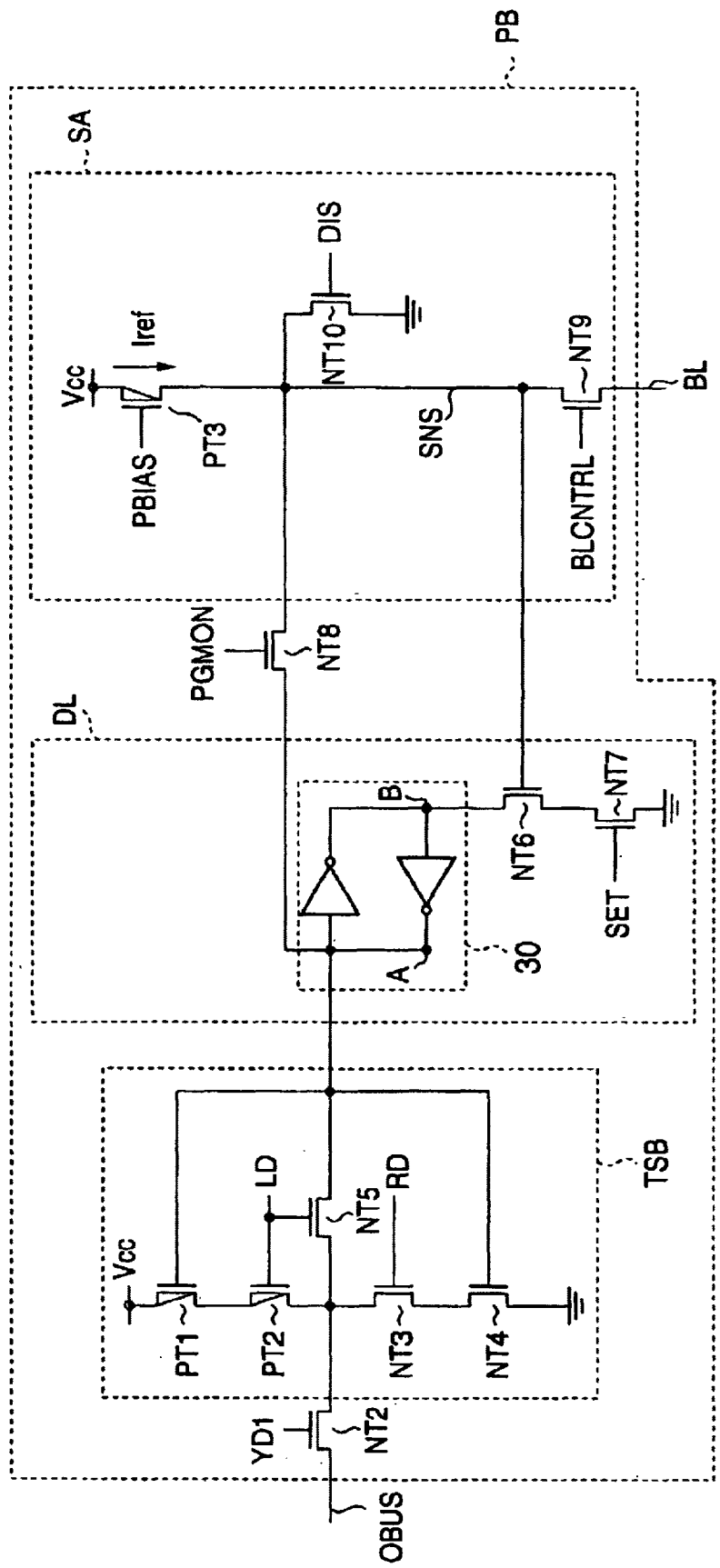
FIG. 4 is a circuit diagram showing the configuration of the page buffer circuit showed in FIG. 1.
Figure 5:
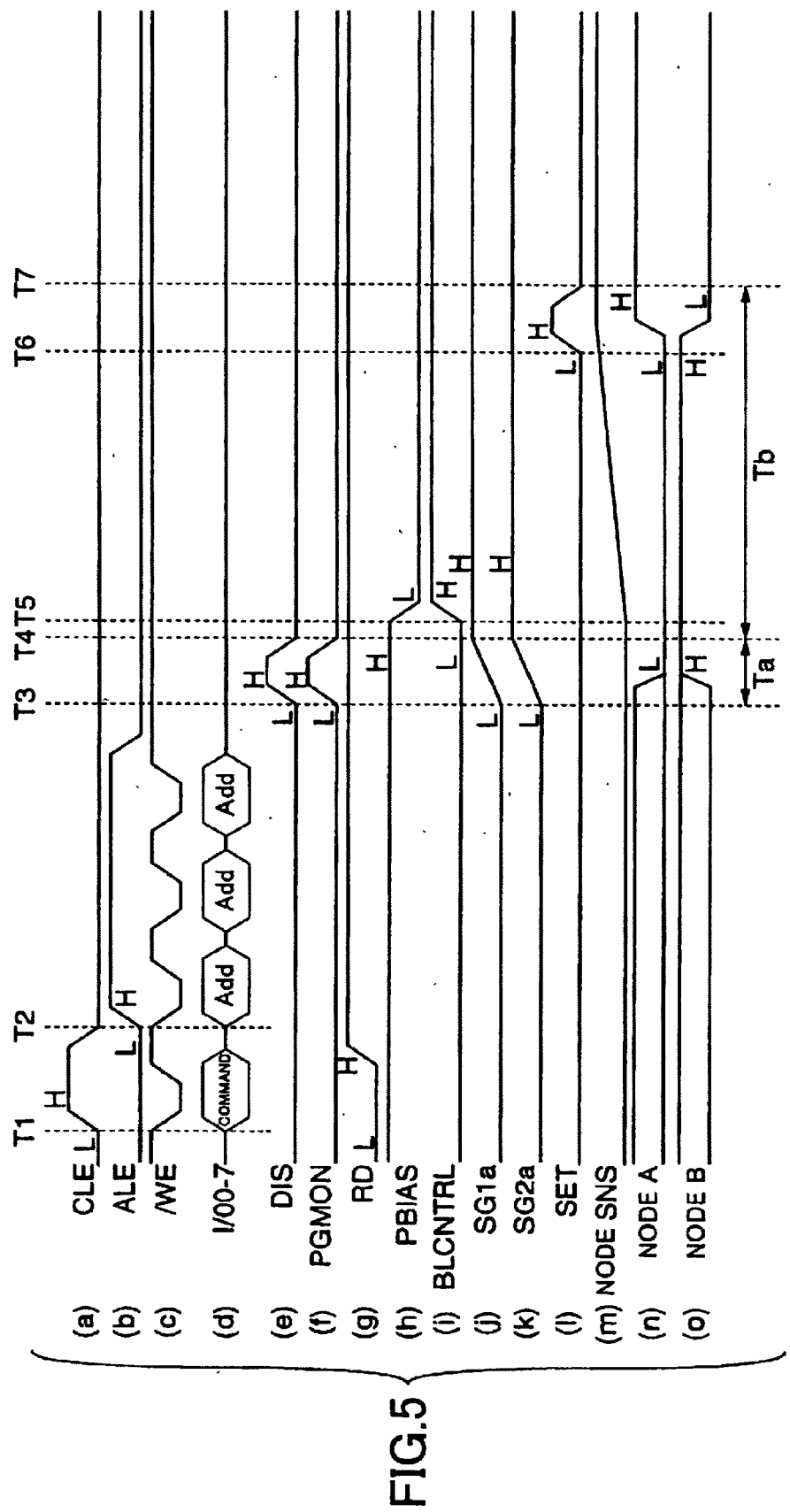
FIG. 5 is a timing chart showing the transfer of data "0" in the memory cell array showed in FIGS. 2 and 3.
Figure 6:
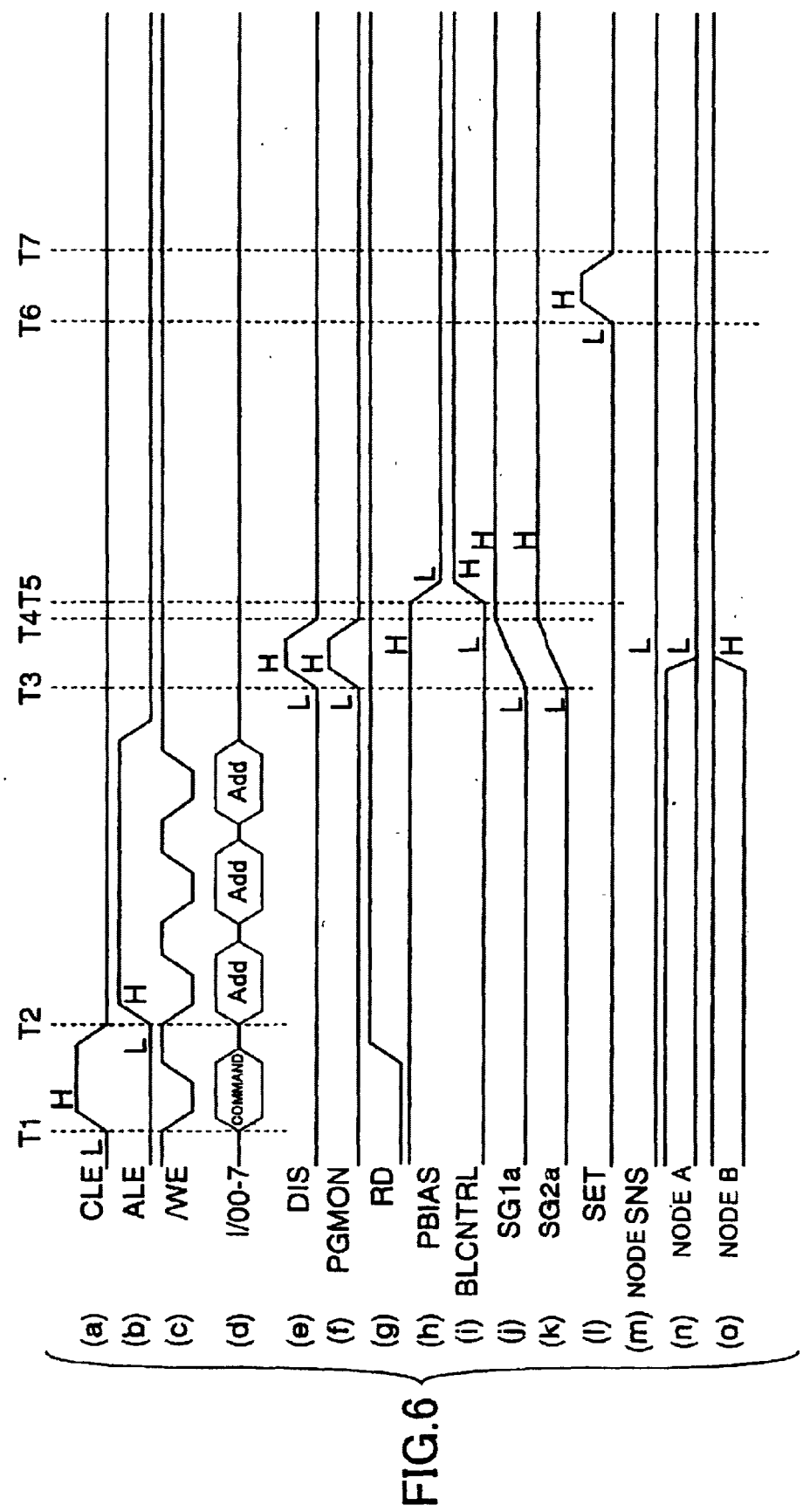
FIG. 6 is a timing chart showing the transfer of data "1" in the memory cell array showed in FIGS. 2 and 3.

As showed in FIG. 10(n), because the voltage of the node SNS is at the high level, the N-channel MOS transistor NT7 showed in FIG. 4 is turned on and the node B of the data latch circuit DL is drawn to a low level. As showed in FIGS. 10(o) and (p), the node A turns to a high level and the node B turns to a low level at time T7. As a result, data output at the node A is inverted by the tri-state buffer TSB, and data "0" are provided to the I/O control circuit 7 via the bus OBUS. In addition, the I/O control circuit 7 outputs the data "0" to the exterior via the input output terminals 6.

The reading operation of data "0" from the "$n^{th}$" block (n>2) of a NAND-type flash memory according to the first embodiment will be described by reference to a timing chart showed in FIG. 11. As showed in FIG. 11, the reading of data from the "$n^{th}$" block is similar to the reading of data from the $0^{th}$ block showed in FIG. 10, but different in that, as showed in FIG. 11(j), the signal GSG is set at a high level at time T4, and the bit lines BL2 are connected to the bit lines BL1 by the GSG transistors NTG turning on.

Accordingly, as showed in FIG. 10(i), the signal BLCN-TRL is set at a high level of 1.5V, for example, at time T5, and, as showed in FIG. 10(h), the signal PBIAS is lowered to a low level so that the sense current Iref becomes a desired magnitude, which results in the sense amp circuit SA included in the page buffer circuit PB being connected to the bit lines BL1 and the bit lines BL2. As a result, the above sense current Iref flows in both bit lines BL1 and BL2.

The difference between the sense current Iref and the current flowing through the selected memory cell MC causes voltage at the node SNS showed in FIG. 10(n).

When the memory cell MC stores data "0", the voltage at the node SNS starts rising at time T5 due to the above sense current Iref as showed in FIG. 10(n). As showed in FIGS. 10(n) and (m), the control circuit has the signal SET make a transition to a high level at time T6 at which the voltage at the node SNS stabilizes at the high level. The NAND-type flash memory operates hereafter in the same manner in which data "0" are read from the $0^{th}$ block.

Figure 10:
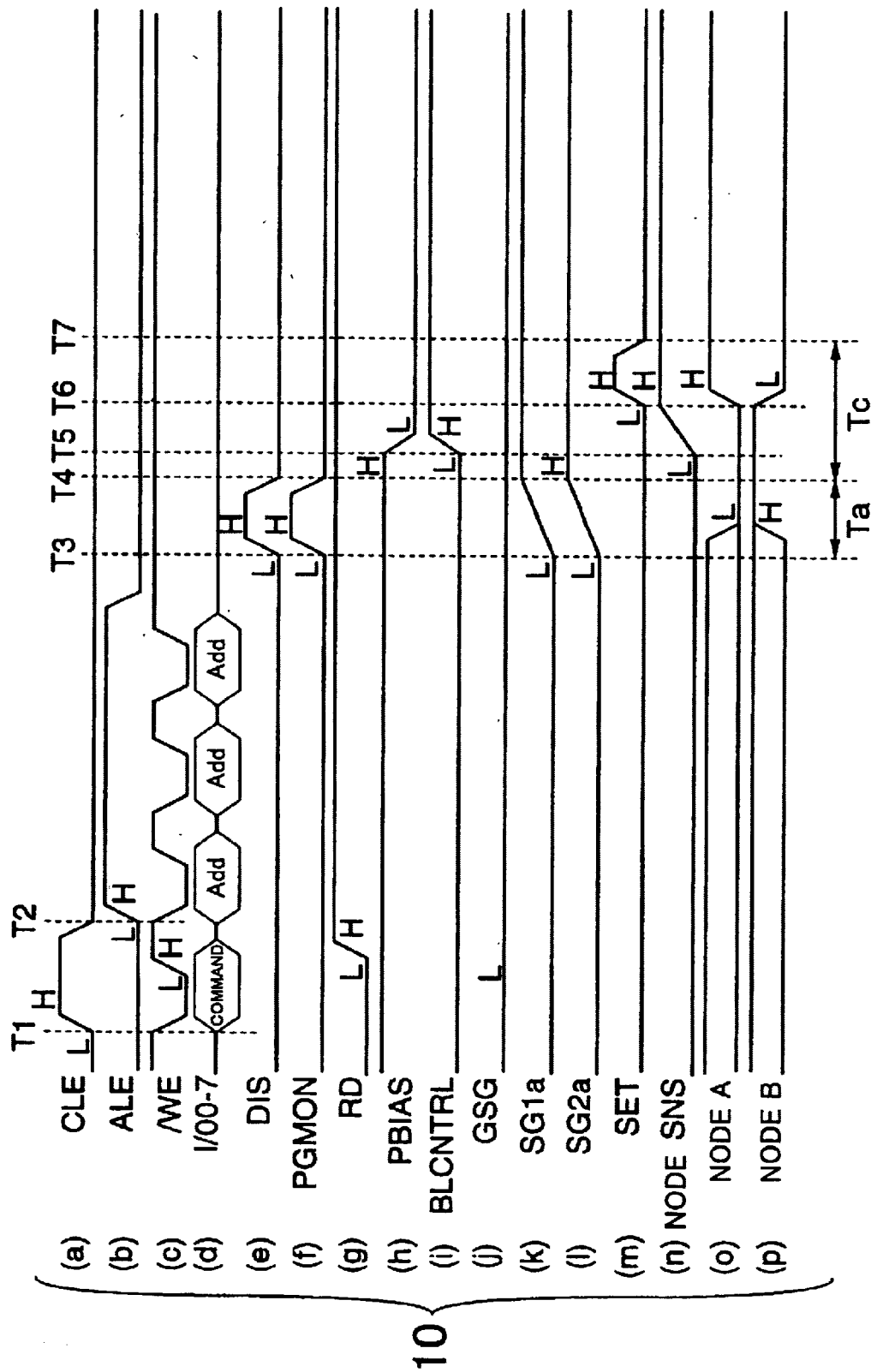
FIG. 10 is a timing chart showing the data transfer of the $0^{th}$ block in the memory cell array showed in FIGS. 7 and 8.
Figure 11:
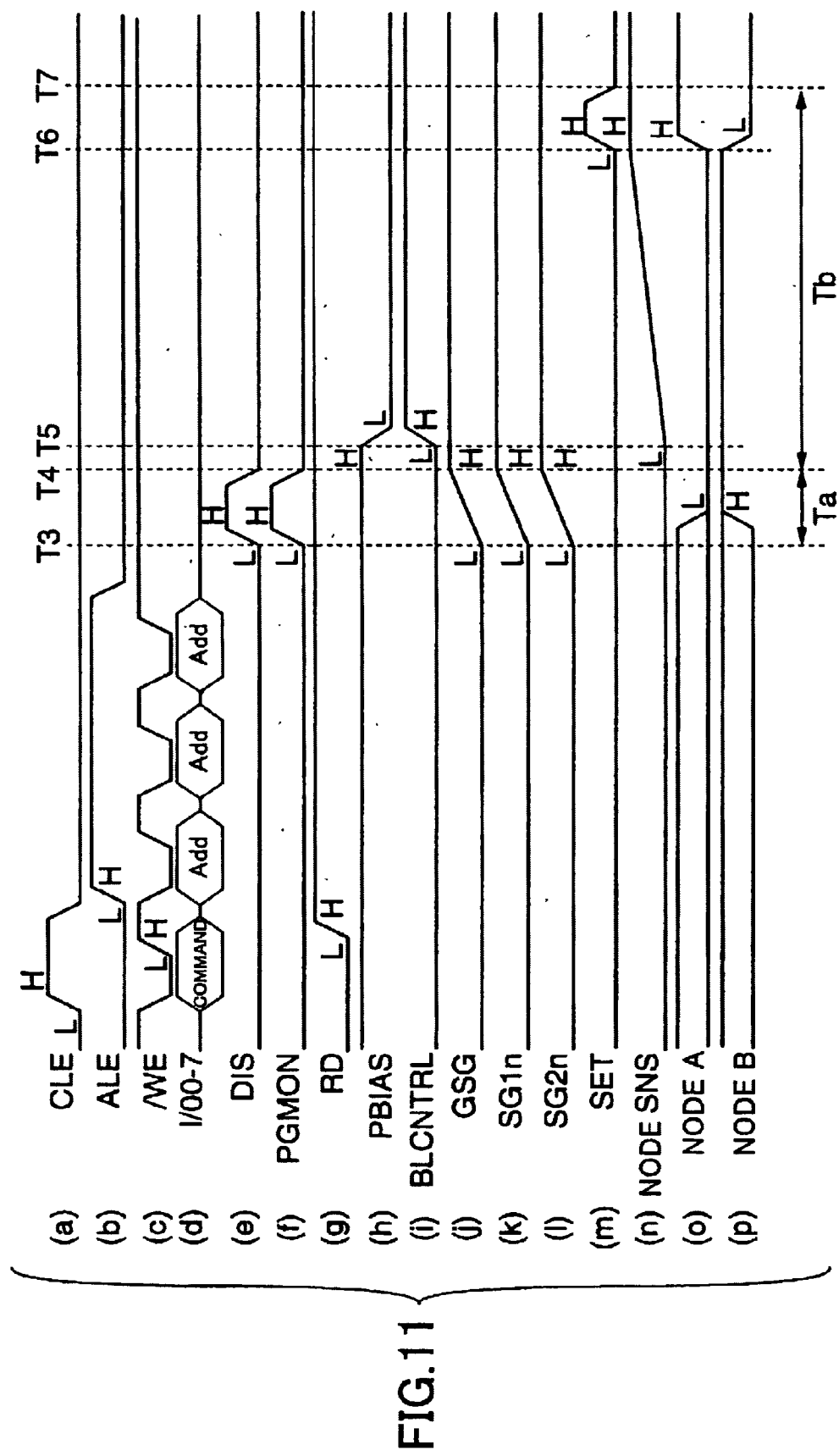
FIG. 11 is a timing chart showing the data transfer of the $n^{th}$ (n>2) block in the memory cell array showed in FIGS. 7 and 8.
Figure 12:
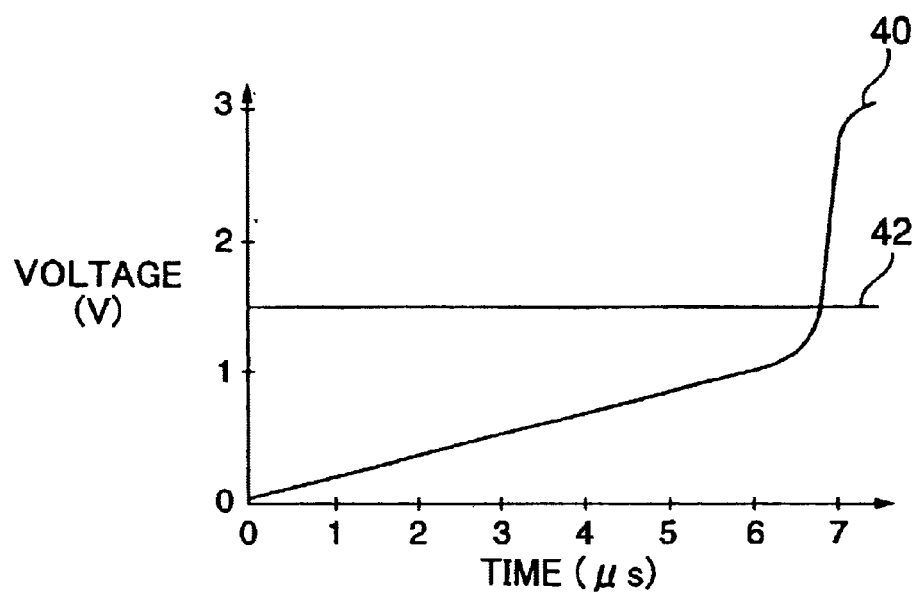
FIG. 12 is a wave form diagram of a SNS signal showing the data transfer operation of a conventional NAND-type flash memory provided with a memory cell array showed in FIGS. 2 and 3.
Figure 13:
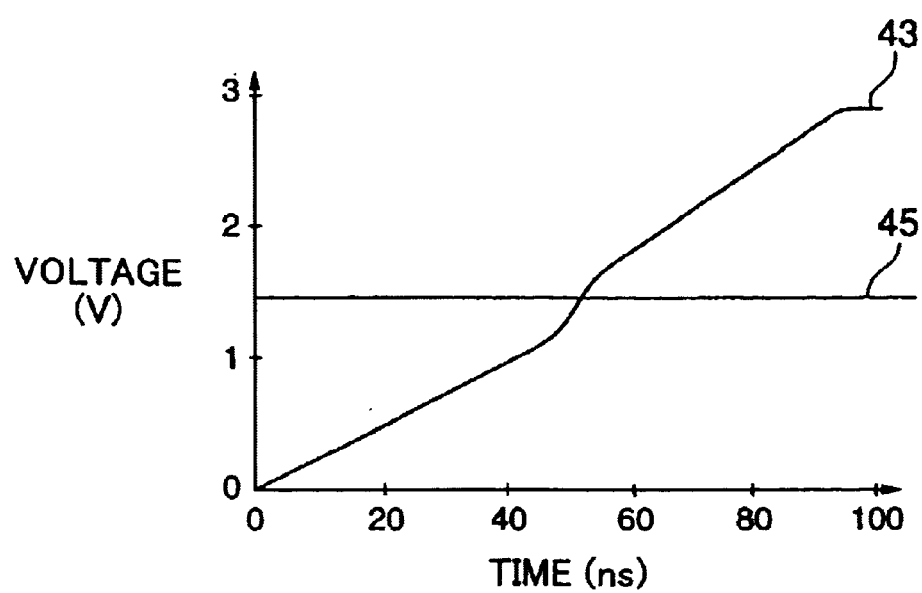
FIG. 13 is a wave form diagram of a SNS signal showing the data transfer operation of the NAND-type flash memory according to the first embodiment of the present invention provided with a memory cell array showed in FIGS. 7 and 8.

In the above description, time periods $T_c$ and $T_b$ from time T4 to time T7 showed in FIGS. 10 and 11 are time required for the voltage at the node SNS to stabilize. Under such conditions as described below, the time period $T_c$ is about 7.5 µs as showed by a curve 40 in FIG. 12, and the time period $T_b$ is about 100 ns as showed by a curve 43 in FIG. 13. In addition, straight lines 42 and 45 showed in FIGS. 12 and 13, respectively, are the voltage level of the signal BLCNTRL.

The condition is, for example, as follows: the signal BLCNTRL being 1.5 V, the sense current Iref being 1 µA, the capacitance of the bit lines BL1 being 12 fF, the resistance of the bit lines BL1 being 2.7 Ω, the sum of the capacitance of the bit lines BL1 and the bit lines BL2 being 6.12 pF, the sum of the resistance of the bit lines BL1 and the bit lines BL2 being 1.7 kΩ, the number of diffusion layers of the select gate transistors and the GSG transistors connected to the bit lines BL1 (bit line contact) being 3, the number of diffusion layers of the select gate transistors and the GSG transistors connected to the bit lines BL1 and the bit lines BL2 being 1,026.

As described above, a semiconductor memory apparatus provided with a NAND-type flash memory according to the first embodiment of the present invention can output data stored therein at a high speed since bit lines are divided into the bit lines BL1 connected to the page buffer circuit PB and the bit lines BL2, and only the bit lines BL1 separated from the bit lines BL2 are used in the case where data are read from a predetermined number of blocks that are close to the page buffer circuit PB out of the blocks configuring the memory cell array 31.

The semiconductor memory apparatus according to the first embodiment can accelerate accessing data without increasing its circuit scale since a common page buffer PB is used in the case for reading data by activating the bit lines BL1 and in the case for reading data by activating the bit lines BL2.

[The Second Embodiment]

Figure 14:
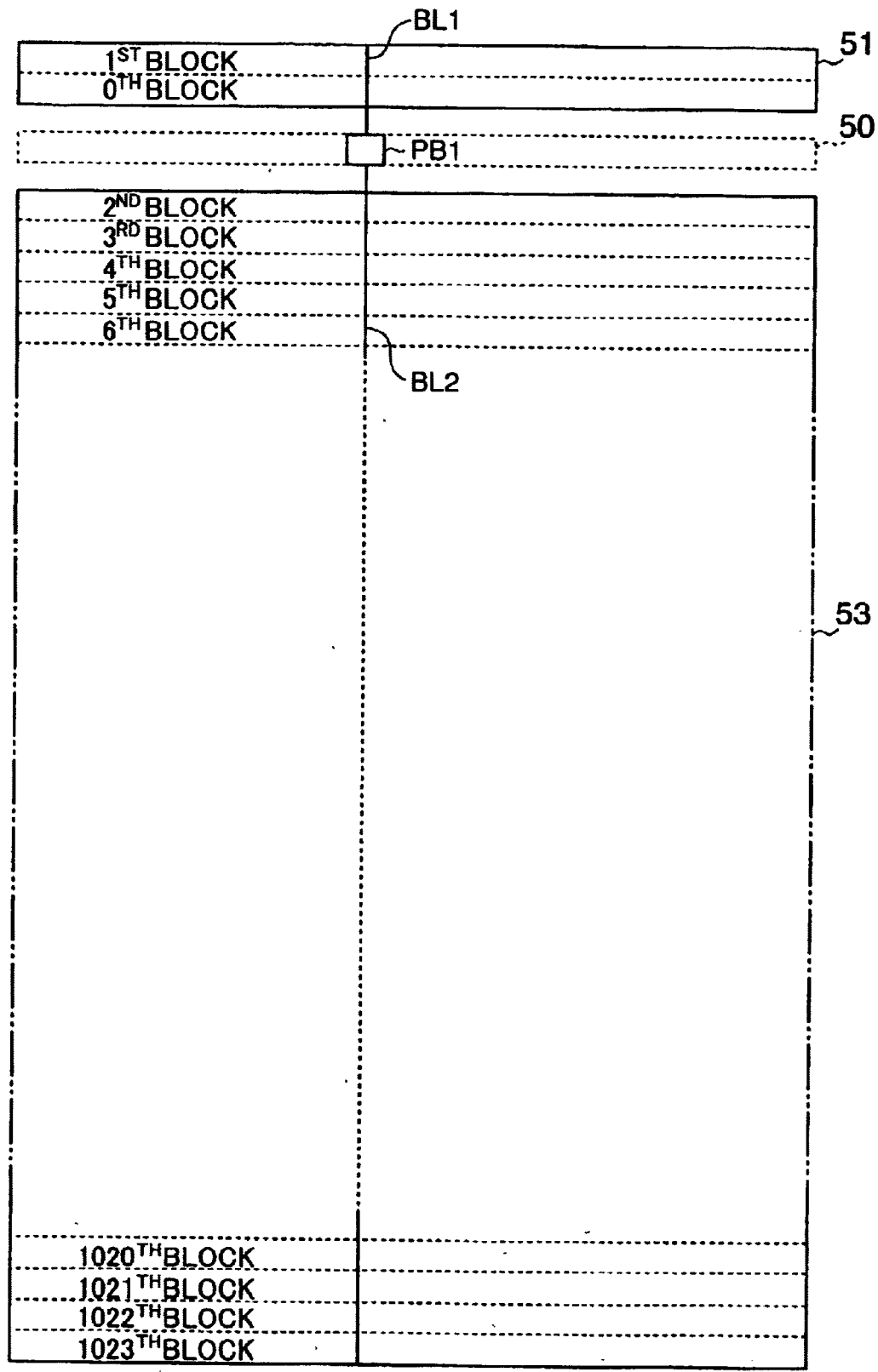
FIG. 14 is a schematic diagram showing the configuration of a NAND-type flash memory included in a semiconductor memory apparatus according to the second embodiment of the present invention.

FIG. 14 is a schematic diagram showing the configuration of a NAND-type flash memory included in a semiconductor memory apparatus according to the second embodiment of the present invention. As showed in FIG. 14, the NAND-type flash memory according to the second embodiment is provided with a memory array divided into the first memory cell region 51 and the second memory cell region 53, and further provided with a region 50 in which a plurality of page buffer circuits PB1 are formed between those two regions.

For example, the first memory cell region 51 includes the $0^{th}$ block and the $1^{st}$ block, and the second memory cell region 53 includes from the $2^{nd}$ block through the $1,023^{rd}$ block. The first memory cell region 51 includes the bit lines BL1 connected to the page buffer circuit PB1, and the second memory cell region 53 includes the bit lines BL2 connected to the page buffer circuit PB1. The bit lines BL1 and the bit lines BL2 selectable by the same column address are connected to the same page buffer circuit PB1.

In the configuration described above, in the case for accessing memory cells included in the first memory cell region 51, the page buffer circuit PB1 activates only the selected bit lines BL1, and the page buffer circuit PB1 is separated from the bit lines BL2. The bit lines BL2 are separated by a switching means provided in the page buffer circuit PB1 or the second memory cell region 53, or between the region 50 and the second memory cell region 53.

Figure 15:
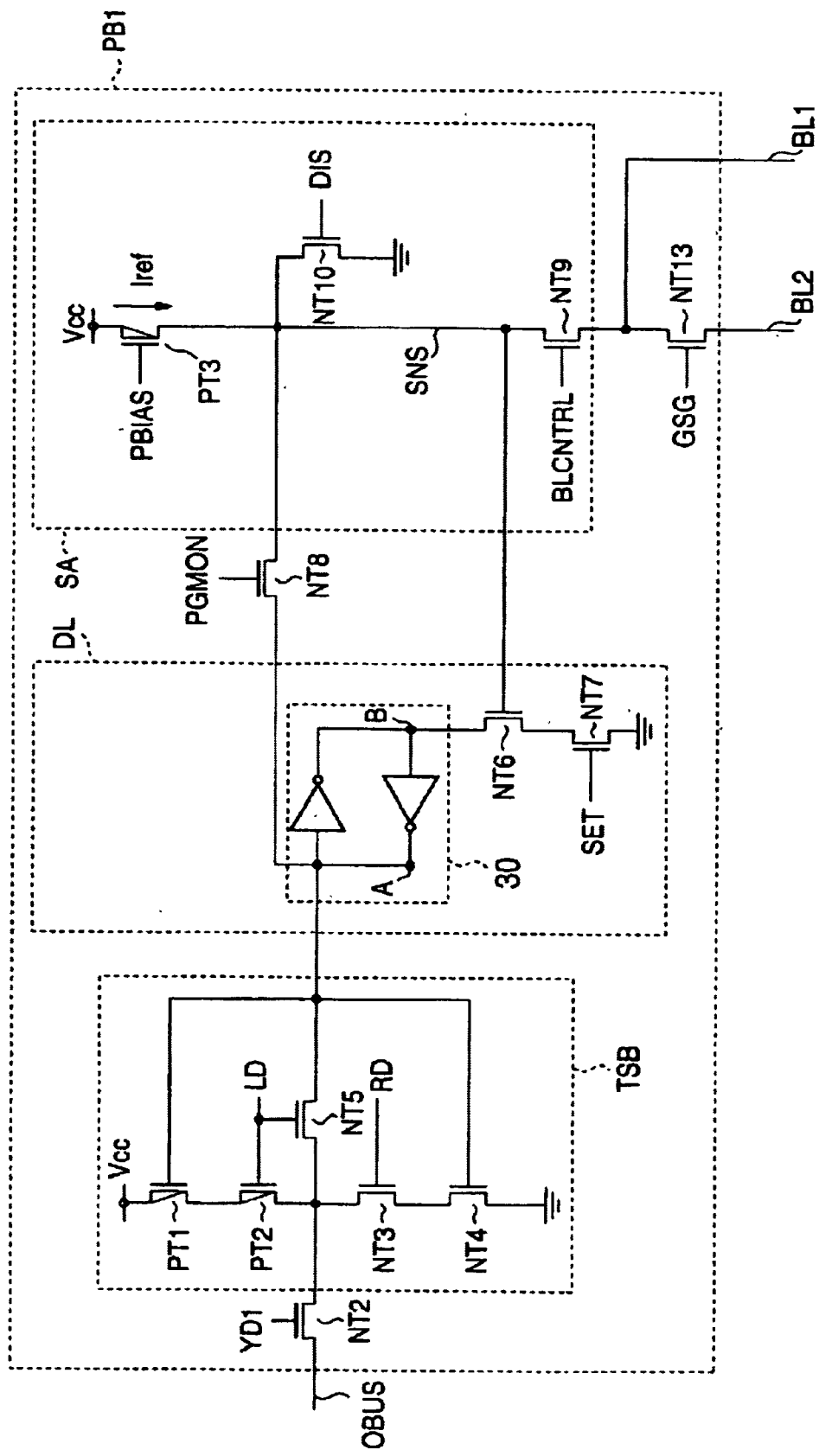
FIG. 15 is a schematic diagram showing an example of a page buffer circuit showed in FIG. 14.

FIG. 15 is a circuit diagram showing the configuration of a page buffer circuit PB1 according to the second embodiment including the above switching means as showed in FIG. 14. As showed in FIG. 15, the page buffer circuit PB1 according to the second embodiment, compared with the page buffer circuit PB showed in FIG. 4, is different in that it is further provided with an N-channel MOS transistor NT13 connected between the N-channel MOS transistor NT9 of which gate the GSG signal is provided to and the bit lines BL2, and the source of the N-channel MOS transistor NT9 is connected to the bit lines BL1. The above N-channel MOS transistor NT13 herein corresponds to the switching means.

For the page buffer circuit PB1 configured as above, in the case where the memory cells included in the first memory cell region 51 are to be accessed, the signal GSG is turned to a low level, and the N-channel MOS transistor NT13 is turned off to separate the bit lines BL2. Consequently, because the page buffer circuit PB1 activates only the selected bit lines BL1, the capacitance of the bit lines to be activated is reduced by the capacitance of the bit lines BL2. Accordingly, the semiconductor memory apparatus according to the second embodiment can randomly access the first memory cell region 51 at a high speed.

In addition, if the memory cells included in the second memory cell region 53 are to be accessed, the signal GSG is set at a high level, and the N-channel MOS transistor NT13 is turned on. Consequently, the page buffer circuit PB1 activates both the bit lines BL1 and the bit lines BL2. Accordingly, the random access time in this case is almost the same as a semiconductor memory apparatus provided with a conventional NAND-type flash memory.

Figure 16:
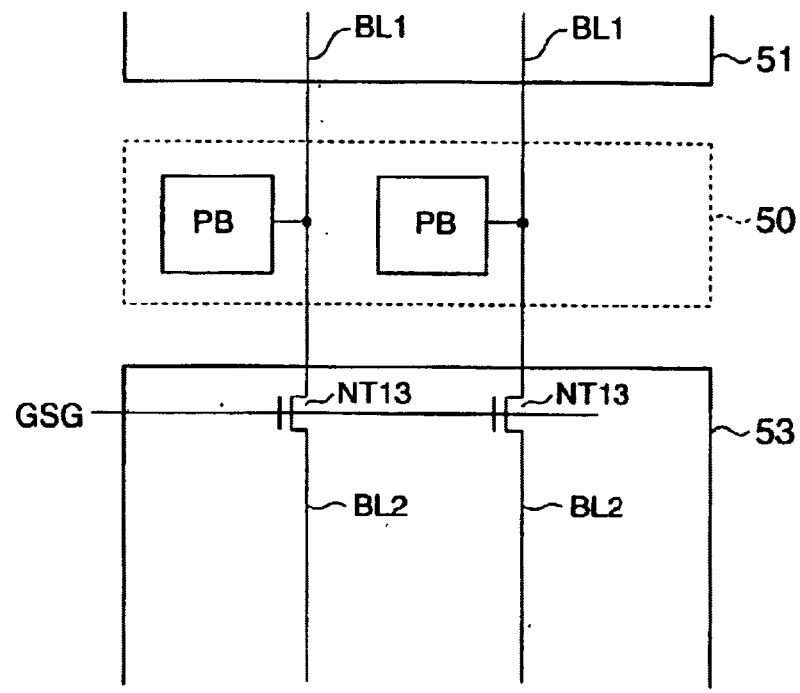
FIG. 16 is a schematic diagram showing another example of a page buffer circuit according to the second embodiment.
Figure 17:
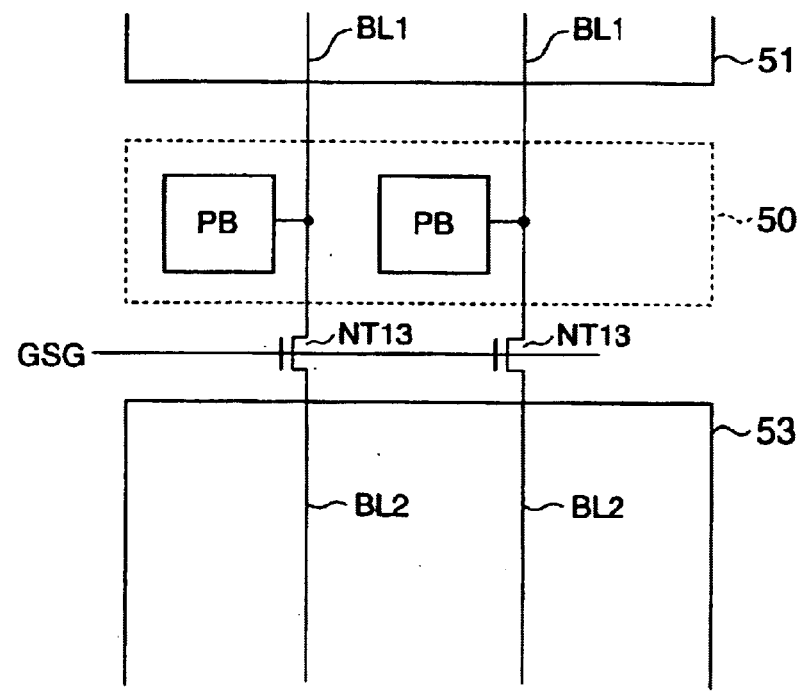
FIG. 17 is a schematic diagram showing yet another example of the page buffer circuit according to the second embodiment.

As described above, the N-channel MOS transistor NT13 corresponding to the switching means may be provided in the second memory cell region 53 as showed in FIG. 16 or between the region 50 and the second memory cell region 53 as showed in FIG. 17. In addition, as showed in FIG. 16, in the case where the N-channel MOS transistor NT13 is disposed in the second memory cell region 53, the N-channel MOS transistor NT13 can be formed in the forming process of the select gate transistors.

Figure 18:
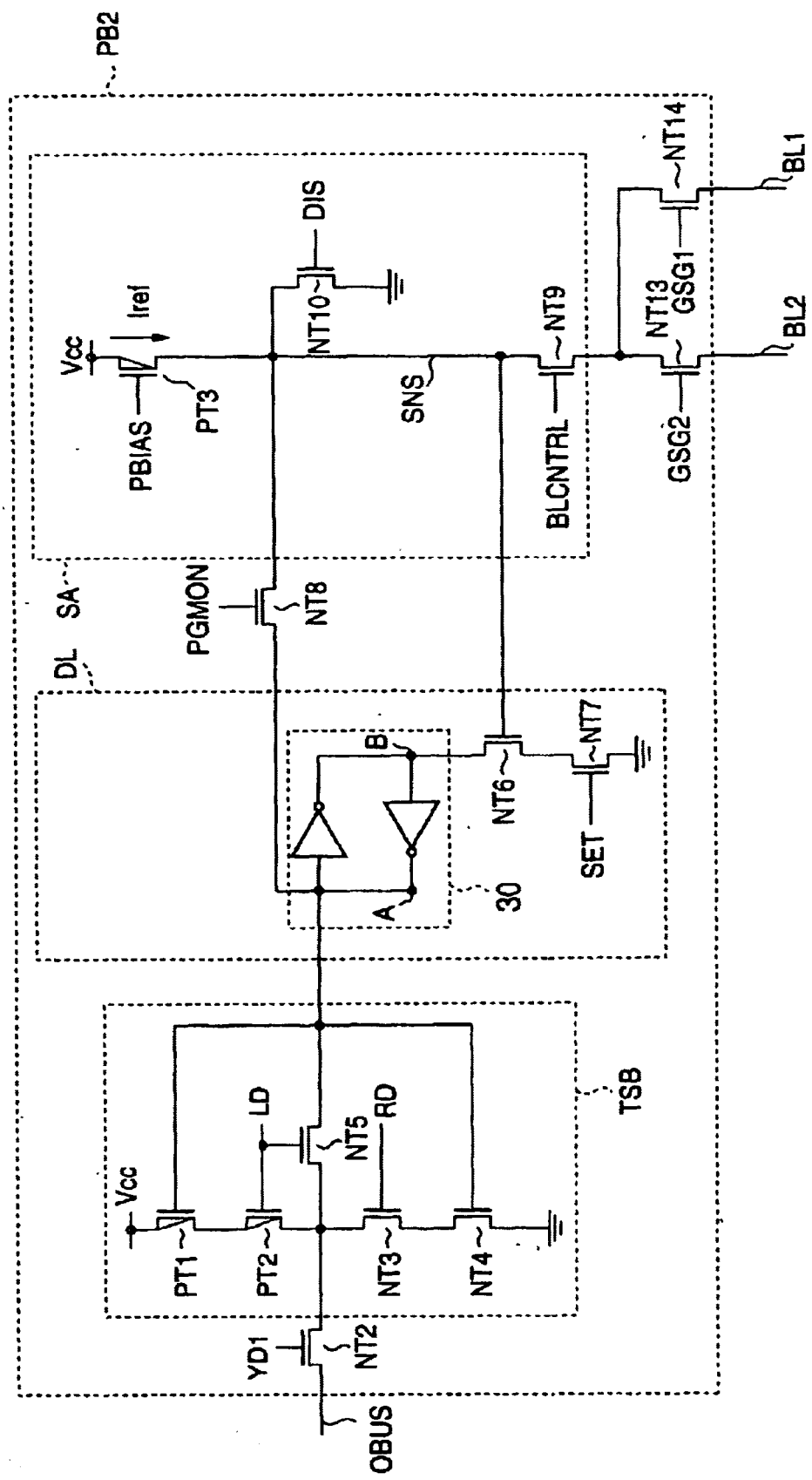
FIG. 18 is a schematic diagram showing yet another example of the page buffer circuit according to the second embodiment.

Furthermore, the semiconductor memory apparatus according to the second embodiment may be provided with page buffer circuits PB2, instead of the above page buffer circuits PB1 showed in FIG. 15, further including N-channel MOS transistors NT14 as showed in FIG. 18.

That is, the N-channel MOS transistors NT14 are connected between the N-channel MOS transistors NT9 and the bit lines BL1, and a signal GSG1 different from the signal GSG2 provided to the gate of each N-channel MOS transistor NT13 is provided to the gate of each N-channel MOS transistor NT14.

The semiconductor memory apparatus provided with the page buffer circuits PB2 configured as above, when accessing the first memory cell region 51 to retrieve data, separates the bit lines BL2 from the page buffer circuits PB2 by turning the signal GSG2 to a low level. The above semiconductor memory apparatus, when accessing the second memory cell region 53, separates the bit lines BL1 from the page buffer circuit PB2 by turning the signal GSG1 to a low level in the same manner. Accordingly, whichever data are retrieved from the first memory cell region 51 or the second memory cell region 53, the capacitance driven by the page buffer circuits PB2 is reduced, and as a result the access time (data retrieval time) can be reduced.

Figure 19:
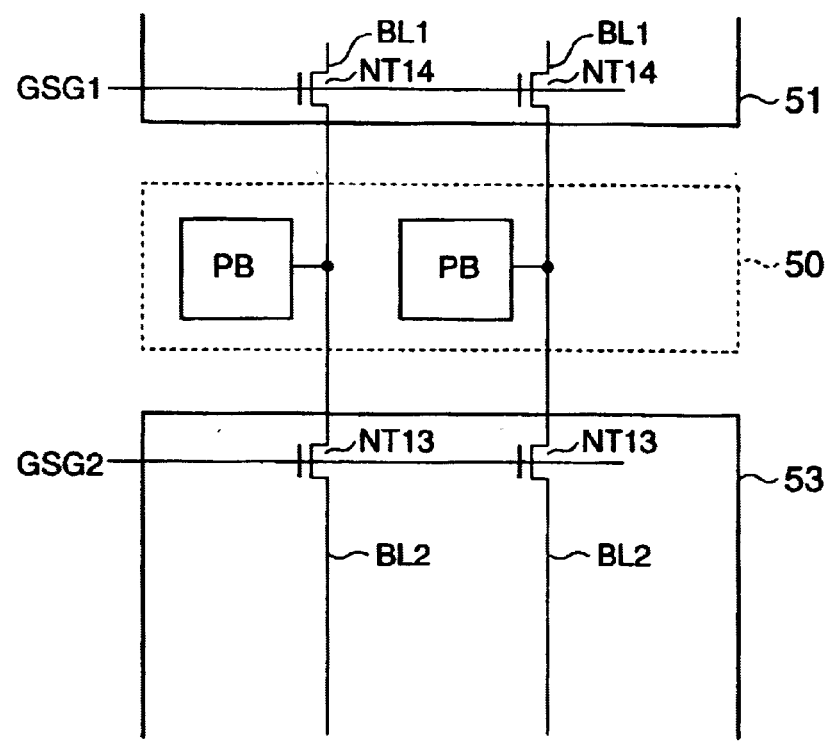
FIG. 19 is a schematic diagram showing yet another example of the page buffer circuit according to the second embodiment.
Figure 20:
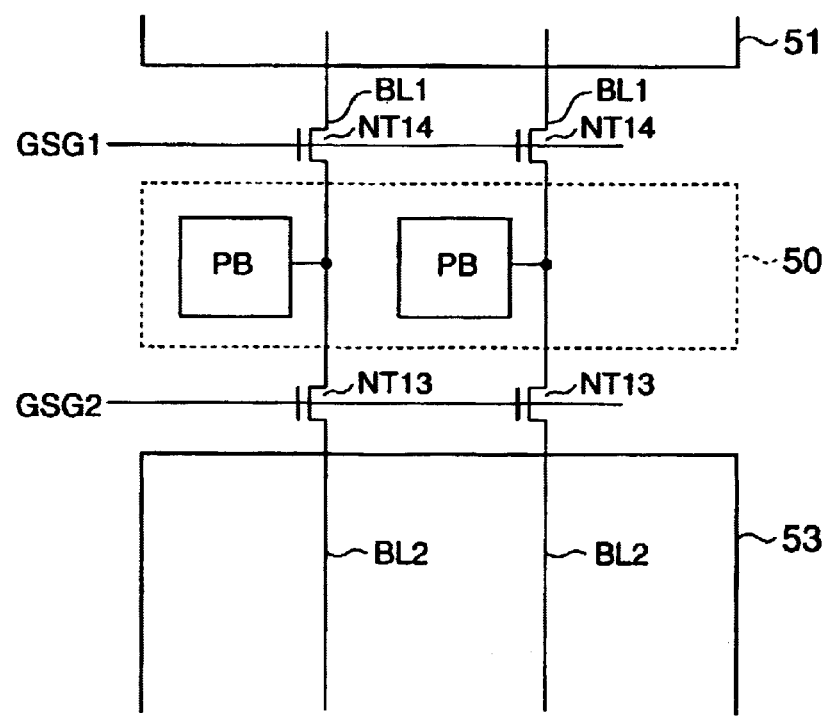
FIG. 20 is a schematic diagram showing yet another example of the page buffer circuit according to the second embodiment.

Additionally, the above N-channel MOS transistors NT14 may be provided in the first memory cell region 51 as showed in FIG. 19, or between the region 50 and the first memory cell region 51 as showed in FIG. 20.

[The Third Embodiment]

Figure 21:
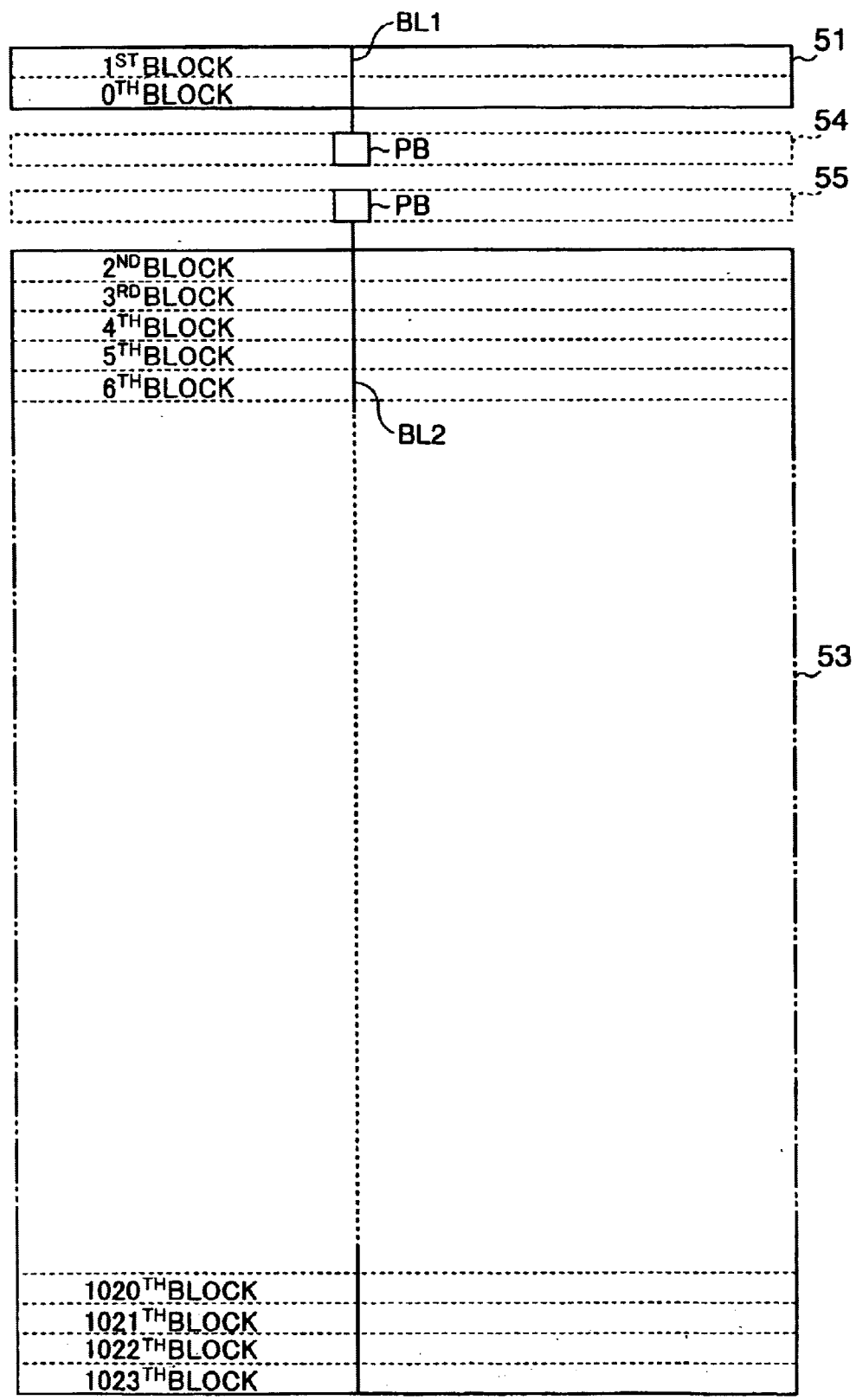
FIG. 21 is a schematic diagram showing the configuration of a NAND-type flash memory included in a semiconductor memory apparatus according to the third embodiment of the present invention.

FIG. 21 is a schematic diagram showing the configuration of a NAND-type flash memory included in a semiconductor memory apparatus according to the third embodiment of the present invention. As showed in FIG. 21, the NAND-type flash memory according to the third embodiment is provided with a memory array divided into the first memory cell region 51 and the second memory cell region 53, and further provided with the first region 54 and the second region 55, in which a plurality of page buffer circuits PB are formed, between the two regions.

For example, the first memory cell region 51 includes the $0^{th}$ block and the $1^{st}$ block, and the second memory cell region 53 includes the $2^{nd}$ block through the $1023^{rd}$ block. The first memory cell region 51 includes the bit lines BL1 connected to the page buffer circuits PB included in the first region 54, and the second memory cell region 53 includes the bit lines BL2 connected to the page buffer circuits PB included in the second region 55.

The semiconductor memory apparatus according to the third embodiment as configured as above, when accessing the memory cells included in the first memory cell region 51, activates only the page buffer circuits PB formed in the first region 54, and drives only the bit lines BL1 connected to the page buffer circuits PB. The semiconductor memory apparatus according to the third embodiment, when accessing the memory cells included in the second memory cell region 53, activates only the page buffer circuits PB formed in the second region 55, and drives only the bit lines BL2 connected to the page buffer circuits PB. Accordingly, the semiconductor memory apparatus according to the third embodiment can reduce the capacitance of the bit lines to be driven by the page buffer-circuits PB, so that it can accelerate the accessing of data stored therein.

What is claimed is:

1. A semiconductor memory apparatus having memory cells, comprising:
    bit lines connected to said memory cells and divided into at least two fractions;
    word lines connected to said memory cells;
    reading circuits connectedly provided between the divided bit lines which read data from said memory cells; and
    switches which connect the divided bit lines to said reading circuits or disconnecting the divided bit lines from said reading circuits depending on a location of said memory cell of which data are to be read, wherein said bit line is divided at least into a first bit line and a second bit line; and
    said reading circuit reads said data from said memory cells connected to said first bit line at a first reading speed, and reads said data from said memory cells connected to said second bit line at a second reading speed different from said first reading speed.

2. The semiconductor memory apparatus as claimed in claim 1, wherein
    said switches, when data stored in said memory cells connected to a first fraction of said bit lines are to be read, disconnects other fractions of said bit lines connected to said reading circuits from said reading circuits.

3. A semiconductor memory apparatus having a NAND-type flash memory including a plurality of serially connected memory cells, comprising:
    a bit line divided at least into a first bit line and a second bit line;
    said first bit line connected to said memory cells;
    said second bit line connected to said memory cells;
    a data reading circuit connected between said first bit line and said second bit line which reads data from said memory cells connected to said first bit line or said second bit line; and
    a switch, serially connected between the first bit line and the second bit line, which disconnects, when said data are read from said memory cells connected to said first bit line, said second bit line from said data reading circuit.

4. The semiconductor memory apparatus as claimed in claim 3, wherein said switch disconnects, when said data are read from said memory cells connected to said second bit line, said first bit line from said data reading circuit.

5. The semiconductor memory apparatus as claimed in claim 3, wherein
    said NAND-type flash memory further comprises a select gate transistor connected to said memory cells;
    said switch is configured by transistors having the same conductivity type as said select gate transistor.

6. A semiconductor memory apparatus having a plurality of memory cells connected to a bit line and a word line, comprising:
    a first memory region including said memory cells that require a first time to access data by activating said bit line and said word line;
    a second memory region including said memory cells that requires a second time to access data by activating said bit line and said word line;
    a reading circuit provided between said firt memory region and said second memory region, that, in whichever said first memory region or said second memory region accessed memory cells are included, reads said data from the accessed memory cells; and
    a switch, connectedly provided between said reading circuit and said second memory region, which disconnects, when said reading circuit reads said data from said first memory region, said second memory region from said reading circuit, wherein
    said bit line is divided at least into a first bit line and a second bit line; and
    said reading circuit leads said data from said memory cells connected to said first bit line at first reading speed, and reads said data from said memory cells connected to said second bit line at a second reading speed different from said first reading speed.

7. A semiconductor memory apparatus having a memory cell array configured by a plurality of memory cells, comprising:

a bit line connected to the plurality of memory cells and divided at least into two fractions;

a word line connected to the plurality of memory cells;

a reading circuit connected to an end of said bit line and disposed at a side of said memory cell array, which reads data from said memory cells; and a switch which connects the divided bit line to said reading circuit or disconnects the divided bit line from said reading circuit depending on a location of said memory cell of which data are to be read, wherein said bit line is divided at least into a first bit line and a second bit line; and said reading circuit reads said data from said memory cells connected to said first bit line at a first reading speed, and reads said data from said memory cells connected to said second bit line at a second reading speed different from said first reading speed.

* * * * *